US012575106B2

(12) United States Patent
Choi et al.

(10) Patent No.: US 12,575,106 B2
(45) Date of Patent: Mar. 10, 2026

(54) THREE-DIMENSIONAL SEMICONDUCTOR MEMORY DEVICE, ELECTRONIC SYSTEM INCLUDING THE SAME

(71) Applicant: SAMSUNG ELECTRONICS CO., LTD., Suwon-si (KR)

(72) Inventors: Moorym Choi, Suwon-si (KR); Jungtae Sung, Suwon-si (KR); Sunil Shim, Suwon-si (KR); Yunsun Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 396 days.

(21) Appl. No.: 18/186,531

(22) Filed: Mar. 20, 2023

(65) Prior Publication Data

US 2024/0040791 A1 Feb. 1, 2024

(30) Foreign Application Priority Data

Jul. 29, 2022 (KR) ........................ 10-2022-0094820

(51) Int. Cl.
*H10B 43/27* (2023.01)
*H01L 23/528* (2006.01)
(Continued)

(52) U.S. Cl.
CPC ......... *H10B 43/40* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search
CPC ................................ H10B 43/27; H10B 43/20
See application file for complete search history.

(56) References Cited

U.S. PATENT DOCUMENTS 8,971,118 B2 3/2015 Jin et al.
10,734,371 B2 8/2020 Park
(Continued)

FOREIGN PATENT DOCUMENTS

KR 20210025032 A 3/2021
KR 10-2021-0117522 A 9/2021

*Primary Examiner* — Christopher A Johnson
(74) *Attorney, Agent, or Firm* — Wolf, Greenfield & Sacks, P.C.

(57) ABSTRACT

A three-dimensional semiconductor memory device is provided. The memory device includes a substrate, a peripheral circuit structure on the substrate, and a cell array structure on the peripheral circuit structure and including a cell array region and a cell array contact region. The cell array structure includes a stack structure including alternately stacked interlayer insulating layers and gate electrodes, a first source conductive pattern, a second source conductive pattern, and a third source conductive pattern sequentially stacked on the stack structure. The first to third source conductive patterns include different materials from each other. Vertical channel structures extending into a lower portion of the first source conductive pattern through the stack structure is included. The first to third source conductive patterns extend from the cell array region to the cell array contact region. The vertical channel structures include vertical semiconductor patterns that contact to the first source conductive pattern.

19 Claims, 23 Drawing Sheets

(51) Int. Cl.

| | |
|---|---|
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |
| *H10B 43/40* | (2023.01) |

(56) References Cited

U.S. PATENT DOCUMENTS

| | | | |
|---|---|---|---|
| 10,998,301 B2 | 5/2021 | Kanamori et al. | |
| 2021/0082877 A1 | 3/2021 | Uchiyama | |
| 2021/0202458 A1 | 7/2021 | Jung et al. | |
| 2022/0068882 A1 | 3/2022 | Xiao et al. | |
| 2022/0068883 A1 | 3/2022 | Xiao et al. | |
| 2022/0077182 A1 | 3/2022 | Lee | |
| 2022/0415918 A1* | 12/2022 | Lee ....................... | H10B 41/27 |

\* cited by examiner

BM  FM
TCP

D3
D2
D1

<u>Q</u>

SW3      PP2

SCP3
SCP2  SC
SCP1

188

SW2

60      ILDa

PP1  BM  FM    SW1
DCP

D3
D2
D1

THREE-DIMENSIONAL SEMICONDUCTOR MEMORY DEVICE, ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0094820, filed on Jul. 29, 2022, in the Korean Intellectual Property Office, the entire contents of which are hereby incorporated by reference.

BACKGROUND OF THE INVENTION

The inventive concept relates to a three-dimensional semiconductor memory device, a method of manufacturing the same, and an electronic system including the same, and more particularly, relates to a three-dimensional semiconductor memory device including a peripheral circuit structure and a cell array structure coupled to each other through bonding pads, a method of manufacturing the same, and an electronic system including the same.

A need arises to have a semiconductor device capable of storing a large amount of data in an electronic system which reads data. Semiconductor devices have been highly integrated for high performance and low manufacturing costs, which are attributes desired by customers. Integration of typical two-dimensional or planar semiconductor devices is primarily determined by the area occupied by a unit memory cell, such that it is greatly influenced by the level of technology for forming fine patterns. However, the expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

An object of the inventive concept is to provide a three-dimensional semiconductor memory device having improved electrical characteristics and reliability, and a method of manufacturing the same.

An object of the inventive concept is to provide a three-dimensional semiconductor memory device capable of simplifying a process and a method of manufacturing the same.

The problem to be solved by the inventive concept is not limited to the above-mentioned problems, and other problems not mentioned will be clearly understood by those of ordinary skill in the art from the following description.

A three-dimensional semiconductor device according to some embodiments of the inventive concept may include a substrate, a peripheral circuit structure on the substrate, and a cell array structure on the peripheral circuit structure and including a cell array region and a cell array contact region, the cell array structure includes a stack structure including alternately stacked interlayer insulating layers and gate electrodes, a first source conductive pattern, a second source conductive pattern, and a third source conductive pattern sequentially stacked on the stack structure and including different materials from each other, and vertical channel structures extending into a lower portion of the first source conductive pattern through the stack structure, the first to third source conductive patterns extend from the cell array region to the cell array contact region, and the vertical channel structures include vertical semiconductor patterns that contact to the first source conductive pattern.

A three-dimensional semiconductor device according to some embodiments of the inventive concept may include a substrate, a peripheral circuit structure on the substrate, and a cell array structure provided on the peripheral circuit structure and including a cell array region and a cell array contact region, the cell array structure includes a stack structure including alternately stacked interlayer insulating layers and gate electrodes, a first source conductive pattern, a second source conductive pattern, and a third source conductive pattern sequentially stacked on the stack structure and including different materials from each other, vertical channel structures penetrating through the stack structure and extending into a lower portion of the first source conductive pattern, cell contact plugs electrically connected to each of the gate electrodes in the cell array contact region, a source contact plug in the cell array contact region, and bit lines electrically connected to the cell contact plugs, the second source conductive pattern has a first protrusion extending onto a sidewall of the first source conductive pattern, and a top surface of the source contact plug is in contact with the first protrusion.

An electronic system including a three-dimensional semiconductor device according to some embodiments of the inventive concept may include a three-dimensional semiconductor memory device including a substrate, a peripheral circuit structure on the substrate, and a cell array structure on the peripheral circuit structure and including a cell array region and a cell array contact region and a controller electrically connected to the three-dimensional semiconductor memory device and configured to control the three-dimensional semiconductor memory device, the cell array structure includes a stack structure including alternately stacked interlayer insulating layers and gate electrodes, a first source conductive pattern, a second source conductive pattern, and a third source conductive pattern sequentially stacked on the stack structure and including different materials from each other, vertical channel structures penetrating the stack structure and extending into a lower portion of the first source conductive pattern, and a source contact plug in the cell array contact region, the second source conductive pattern has a protrusion extending onto a sidewall of the first source conductive pattern, and the source contact plug partially penetrates the protrusion of the second source conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 2 is a perspective view schematically illustrating an electronic system including a three-dimensional semiconductor memory device according to embodiments of the inventive concept.

FIGS. 3 and 4 are cross-sectional views respectively taken along lines I-I' and II-II' of FIG. 2, illustrating a semiconductor package including a three-dimensional semiconductor memory device according to embodiments of the inventive concept.

FIGS. 8B, 111B, 12B, 13B, and 14B are cross-sectional views taken along line II-II' of FIG. 5, illustrating a method of manufacturing a three-dimensional semiconductor memory device according to embodiments of the inventive concept.

DETAILED DESCRIPTION

Hereinafter, a three-dimensional semiconductor memory device, a method of manufacturing the same, and an electronic system including the same according to embodiments of the inventive concept will be described in detail with reference to the drawings.

Figure 1:
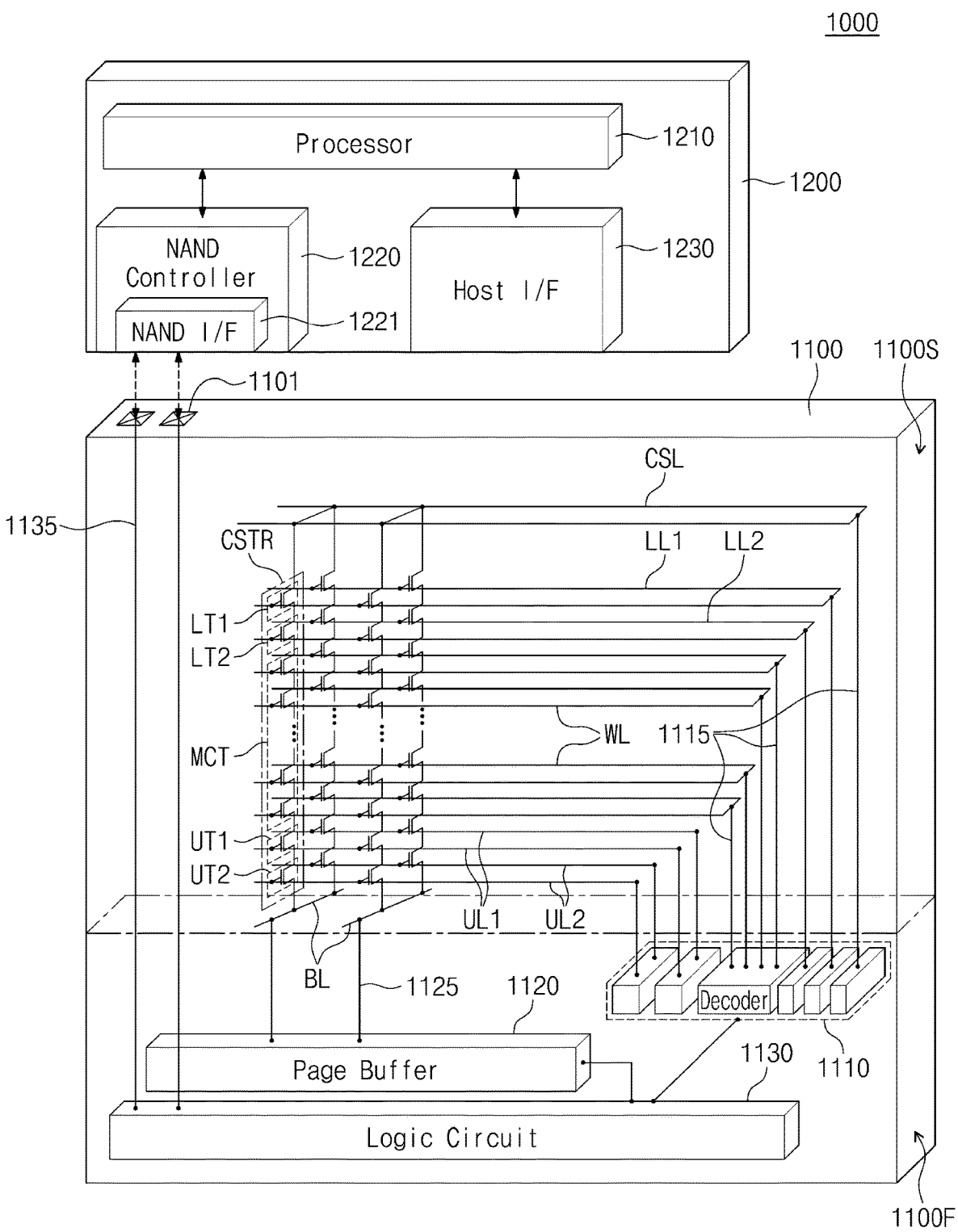
FIG. 1 is a diagram schematically illustrating an electronic system including a three-dimensional semiconductor memory device according to embodiments of the inventive concept.

FIG. 1 is a diagram schematically illustrating an electronic system including a three-dimensional semiconductor memory device according to an embodiment of the inventive concept.

Referring to FIG. 1, an electronic system 1000 according to an embodiment of the inventive concept may include a three-dimensional semiconductor memory device 1100 and a controller 1200 electrically connected to the three-dimensional semiconductor memory device 1100. The electronic system 1000 may be a storage device including one or a plurality of three-dimensional semiconductor memory devices 1100 or an electronic device including a storage device. For example, the electronic system 1000 may be a solid state drive device (SSD) device, a universal serial bus (USB) device, a computing system, a medical device, or a communication device including one or a plurality of three-dimensional semiconductor memory devices 1100.

The three-dimensional semiconductor memory device 1100 may be a nonvolatile memory device, for example, a three-dimensional NAND flash memory device to be described later. The three-dimensional semiconductor memory device 1100 may include a first region 1100F and a second region 1100S on the first region 1100F. However, differently from that shown in FIG. 1, the first region 1100F may be disposed next to the second region 1100S. The first region 1100F may be a peripheral circuit region including a decoder circuit 1110, a page buffer 1120, and a logic circuit 1130. The second region 1100S may be a memory cell region including bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL and second transistors UT1 and UT2 adjacent to the bit lines BL and a plurality of memory cell transistors MCT disposed between the first transistors LT1 and LT2 and the second transistors UT1 and UT2. The number of the first transistors LT1 and LT2 and the number of the second transistors UT1 and UT2 may be variously modified in accordance with embodiments. The memory cell strings CSTR may be disposed between the common source line CSL and the first region 1100F.

For example, the second transistors UT1 and UT2 may include a string select transistor, and the first transistors LT1 and LT2 may include a ground select transistor. First lines LL1 and LL2 may include gate electrodes of the first transistors LT1 and LT2. The word lines WL may include gate electrodes of the memory cell transistors MCT, and second lines UL1 and UL2 may include gate electrodes of the second transistors UT1 and UT2.

For example, the first transistors LT1 and LT2 may include a first erase control transistor LT1 and a ground select transistor LT2 electrically connected in series. For example, the second transistors UT1 and UT2 may include a string select transistor UT1 and a second erase control transistor UT2 electrically connected in series. At least one of the first erase control transistor LT1 and the second erase control transistor UT2 may be employed to perform an erase operation in which a gate induced leakage current (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection wirings 1115 that extend from the first region 1100F to the second region 1100S. The bit lines BL may be electrically connected to the page buffer 1120 through second connection wirings 1125 that extend from the first region 1100F to the second region 1100S.

In the first region 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection wiring 1135 that extend from the first region 1100F to the second region 1100S.

The controller 1200 may include a processor 1210, a NAND controller 1220, and a host interface 1230. In some embodiments, the electronic system 1000 may include a plurality of three-dimensional semiconductor memory devices 1100. In this case, the controller 1200 may control the plurality of three-dimensional semiconductor memory devices 1100.

The processor 1210 may control overall operations of the electronic system 1000 including the controller 1200. The processor 1210 may operate based on certain firmware, and may control the NAND controller 1220 to access the three-dimensional semiconductor memory device 1100. The NAND controller 1220 may include a NAND interface 1221 that processes communication with the three-dimensional semiconductor memory device 1100. The NAND interface 1221 may be used to transfer therethrough a control command to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from the external host, the three-dimensional semiconductor memory device 1100 may be controlled by the processor 1210 in response to the control command.

Figure 2:
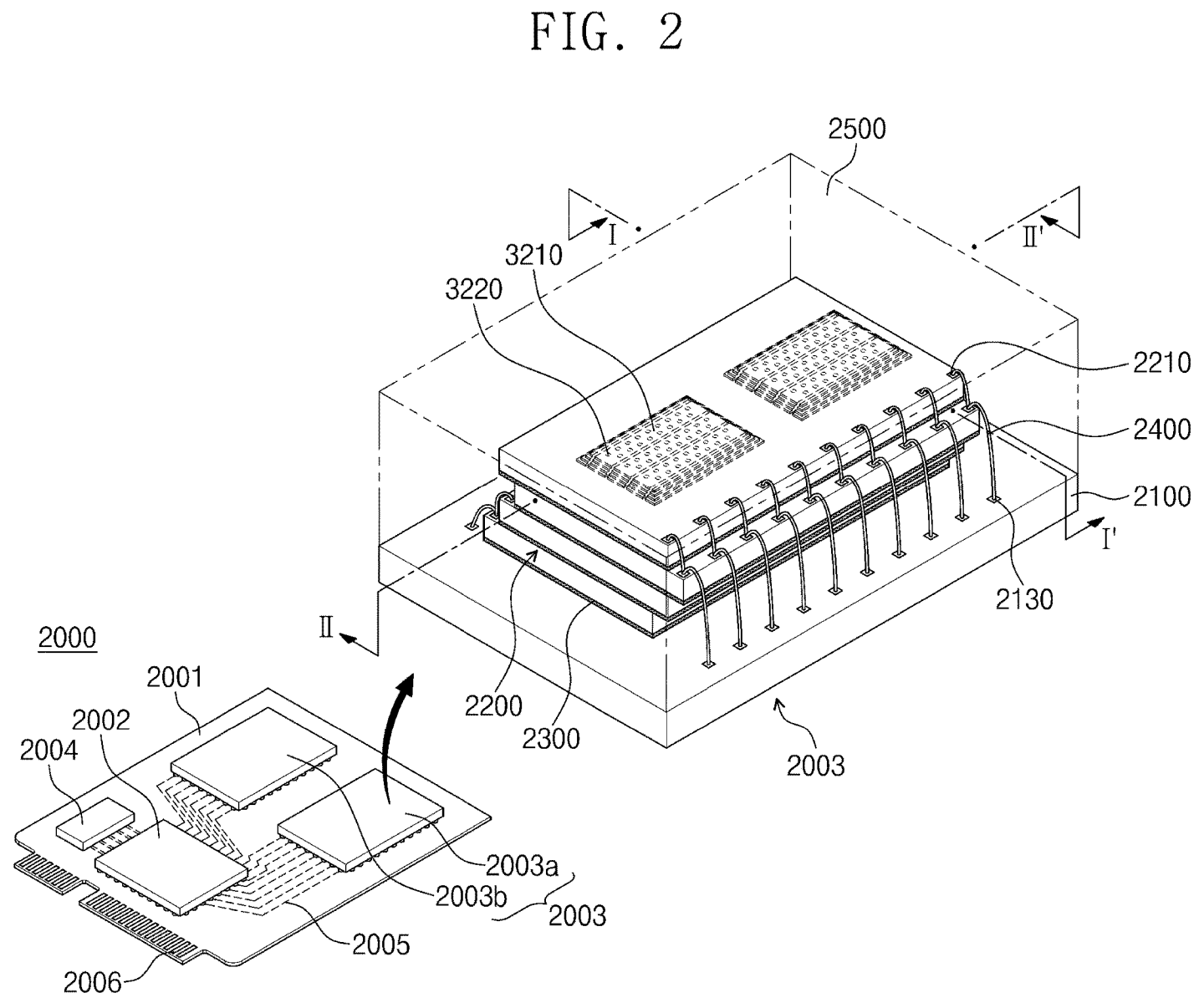

FIG. 2 is a perspective view schematically illustrating an electronic system including a three-dimensional semiconductor memory device according to embodiments of the inventive concept.

Referring to FIG. 2, an electronic system 2000 according to an embodiment of the inventive concept may include a main board 2001, a controller 2002 mounted on the main board 2001, one or more semiconductor packages 2003, and a dynamic random access memory (DRAM) 2004. The semiconductor package 2003 and the DRAM 2004 may be electrically connected to the controller 2002 through wiring patterns 2005 provided on the main board 2001.

The main board 2001 may include a connector 2006 including a plurality of pins which are provided to have electrical connection with an external host. The number and arrangement of the plurality of pins on the connector 2006 may be changed based on a communication interface between the electronic system 2000 and the external host. The electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). For example, the electronic system 2000 may operate with power supplied through the connector 2006 from the external host. The electronic system 2000 may further include a power management integrated circuit (PMIC) that distributes the power supplied from the external host to the controller 2002 and the semiconductor package 2003.

The controller 2002 may write data to or read data from the semiconductor package 2003, and may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for control of the semiconductor package 2003, but a DRAM controller for control of the DRAM 2004.

The semiconductor package 2003 may include a first semiconductor package 2003*a* and a second semiconductor package 2003*b* that are spaced apart from each other. However, the number of semiconductor packages in the semiconductor package 2003 may vary and not be limited thereto. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers or overlaps the semiconductor chips 2200 and the connection structures 2400.

The package substrate 2100 may be an integrated circuit board including package upper pads 2130. Each of the semiconductor chips 2200 may include input/output pads 2210. The input/output pads 2210 may correspond to the input/output pad 1101 of FIG. 1. Each of the semiconductor chips 2200 may include gate stack structures 3210 and memory channel structures 3220. Each of the semiconductor chips 2200 may include a three-dimensional semiconductor memory device which will be discussed below.

The connection structures 2400 may be, for example, bonding wires that electrically connect the input/output pads 2210 to the package upper pads 2130. Therefore, on each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some embodiments, on each of the first and second semiconductor packages 2003*a* and 2003*b*, the semiconductor chips 2200 may be electrically connected to each other using through-silicon vias instead of the connection structures 2400 of the bonding wires.

Differently from that shown in FIG. 2, the controller 2002 and the semiconductor chips 2200 may be included in a single package. The controller 2002 and the semiconductor chips 2200 may be mounted on a separate interposer substrate other than the main board 2001, and may be electrically connected to each other through wiring provided in the interposer substrate.

Figure 3:
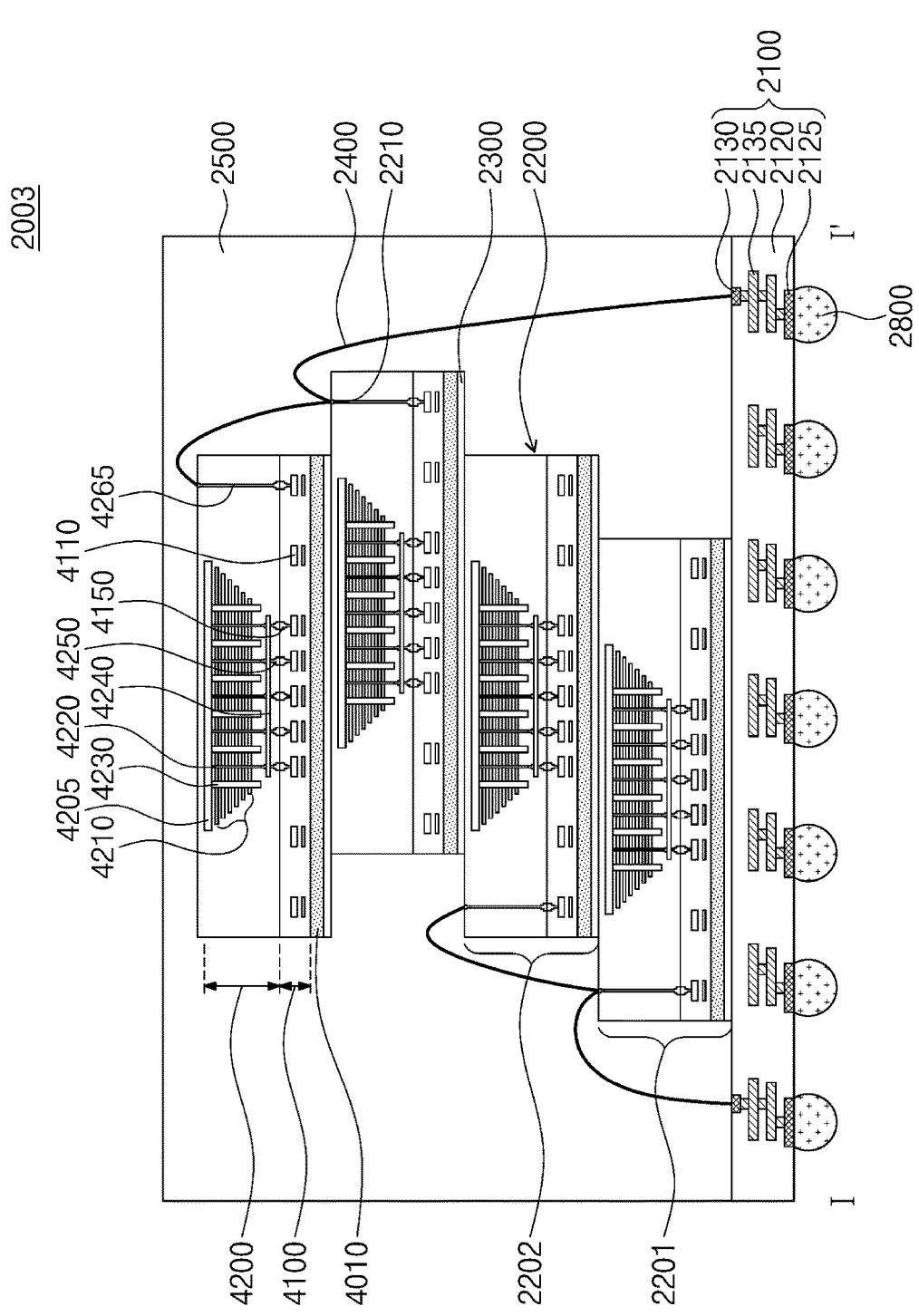
Figure 4:
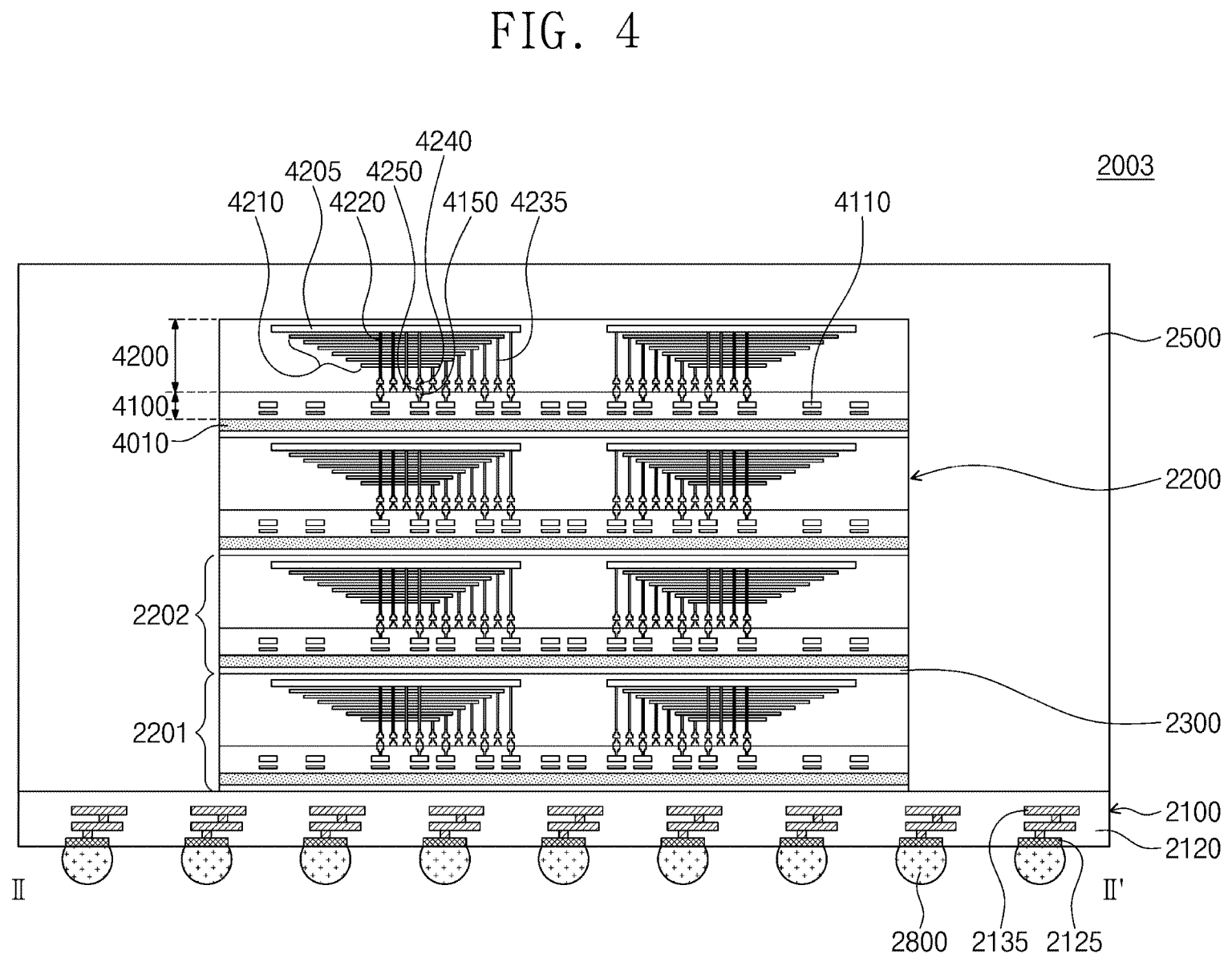

FIGS. 3 and 4 are cross-sectional views respectively taken along lines I-I' and II-II' of FIG. 2, illustrating a semiconductor package that includes a three-dimensional semiconductor memory device according to embodiments of the inventive concept.

Referring to FIGS. 3 and 4, a semiconductor package 2003 may include a package substrate 2100, a plurality of semiconductor chips 2200 on the package substrate 2100, and a molding layer 2500 that covers or overlaps the package substrate 2100 and the plurality of semiconductor chips 2200.

The package substrate 2100 may include a package substrate body 2120, package upper pads 2130 disposed or exposed on a top surface of the package substrate body 2120, package lower pads 2125 disposed or exposed on a bottom surface of the package substrate body 2120, and internal wiring 2135 that lie in the package substrate body 2120 and electrically connect the package upper pads 2130 to the package lower pads 2125. The package upper pads 2130 may be electrically connected to connection structures 2400. The package lower pads 2125 may be electrically connected through conductive connectors 2800 to the wiring patterns 2005 in the main board 2001 of the electronic system 2000 depicted in FIG. 2.

Referring to FIGS. 2 to 4, one sidewall of the second semiconductor chip 2202 may not be aligned with one sidewall of the first semiconductor chip 2201, and the other sidewall of the second semiconductor chip 2202 may be aligned with the other sidewall of the first semiconductor chip 2201. The first and second semiconductor chips 2201 and 2202 may include substantially the same components.

Each of the semiconductor chips 2200 may include a semiconductor substrate 4010, a first structure 4100 on the semiconductor substrate 4010, and a second structure 4200 on the first structure 4100. The second structure 4200 may be coupled to the first structure 4100 by a wafer bonding manner.

The first structure 4100 may include peripheral circuit wirings 4110 and first bonding pads 4150. The second structure 4200 may include a common source line 4205, a gate stack structure 4210 between the common source line 4205 and the first structure 4100, memory channel structures 4220 and separation structures 4230 passing through the gate stack structure 4210, and second bonding pads 4250 electrically connected to word lines (WL of FIG. 1) of the gate stack structure 4210, respectively. For example, the second bonding pads 4250 may be electrically connected to the memory channel structures 4220 and the word lines (WL of FIG. 1), respectively, through bit lines 4240 electrically connected to the memory channel structures 4220 and the gate connection wirings 4235 electrically connected to the word lines (WL of FIG. 1). The first bonding pads 4150 of the first structure 4100 and the second bonding pads 4250 of the second structure 4200 may be in contact with each other to be coupled to each other. Coupled portions of the first bonding pads 4150 and the second bonding pads 4250 may include, for example, copper (Cu).

Each of the semiconductor chips 2200 may further include an input/output pad 2210 and an input/output connection wiring 4265 electrically connected to the input/output pad 2210. The input/output connection wiring 4265 may be electrically connected to some of the second bonding pads 4250 and some of the peripheral circuit wirings 4110.

Figure 5:
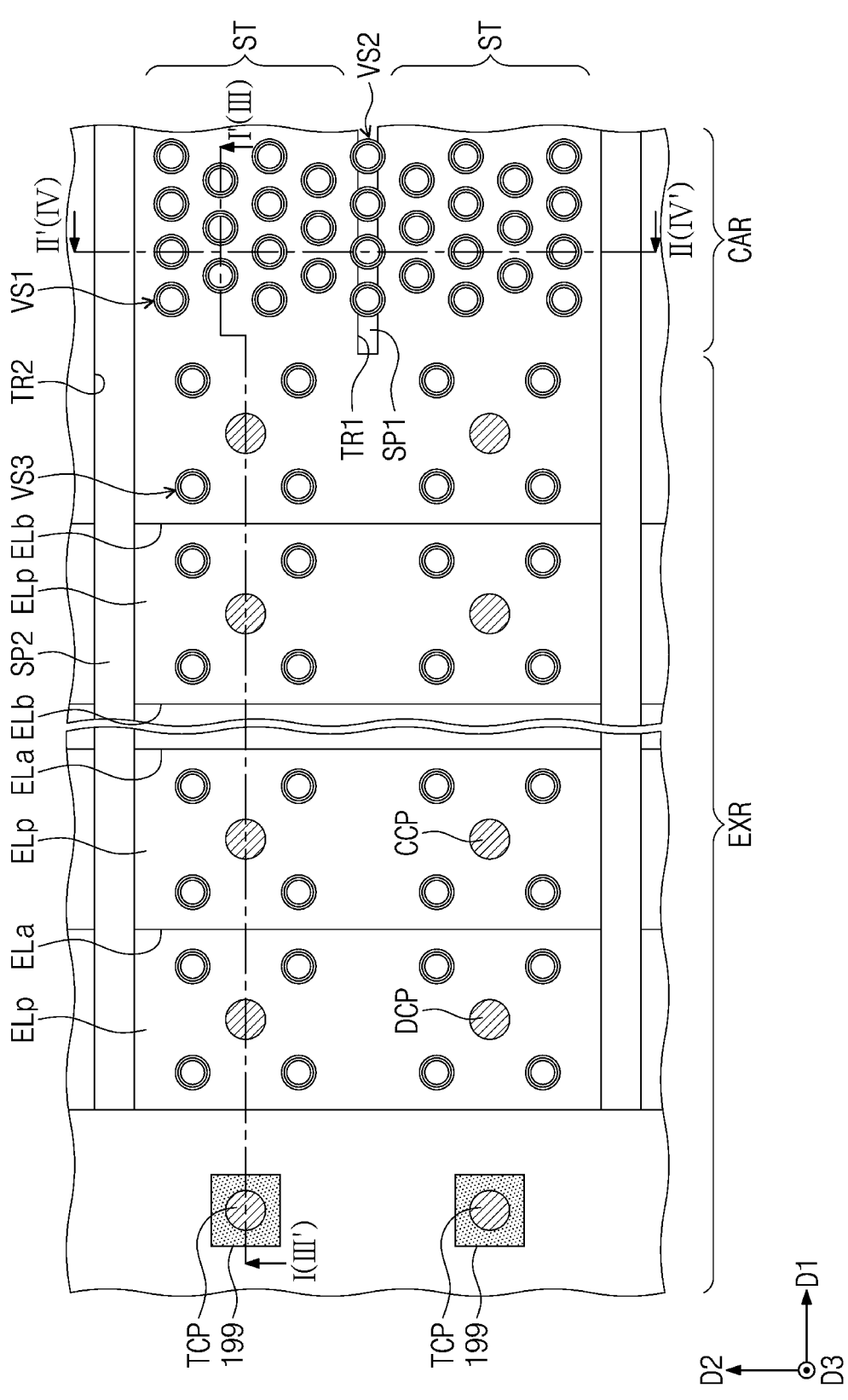
FIG. 5 is a plan view illustrating a three-dimensional semiconductor memory device according to embodiments of the inventive concept.
Figure 6A:
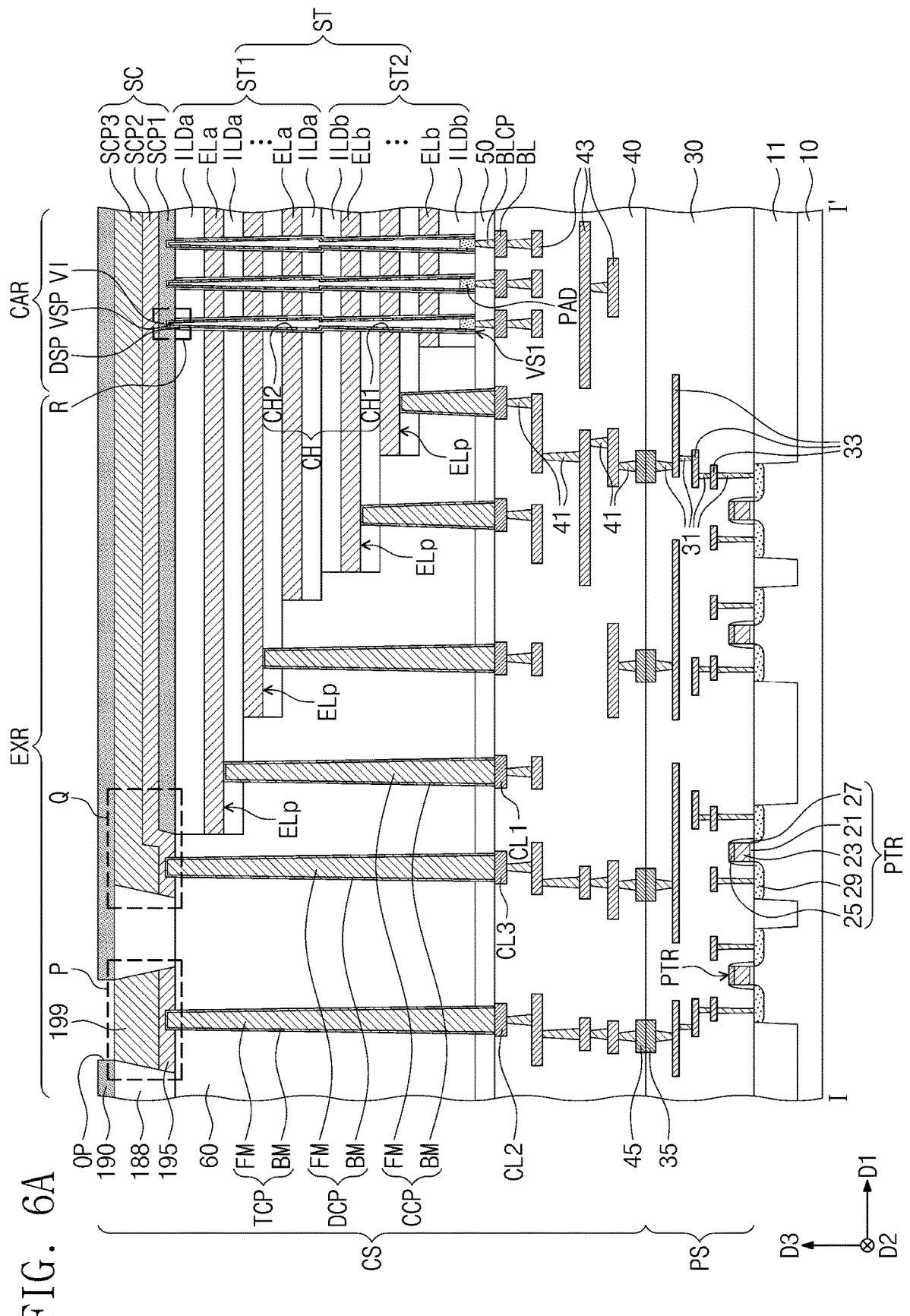
FIGS. 6A and 6B are cross-sectional views taken along lines I-I' and II-II' of FIG. 5, respectively, and illustrating a three-dimensional semiconductor memory device according to embodiments of the inventive concept.
Figure 6B:
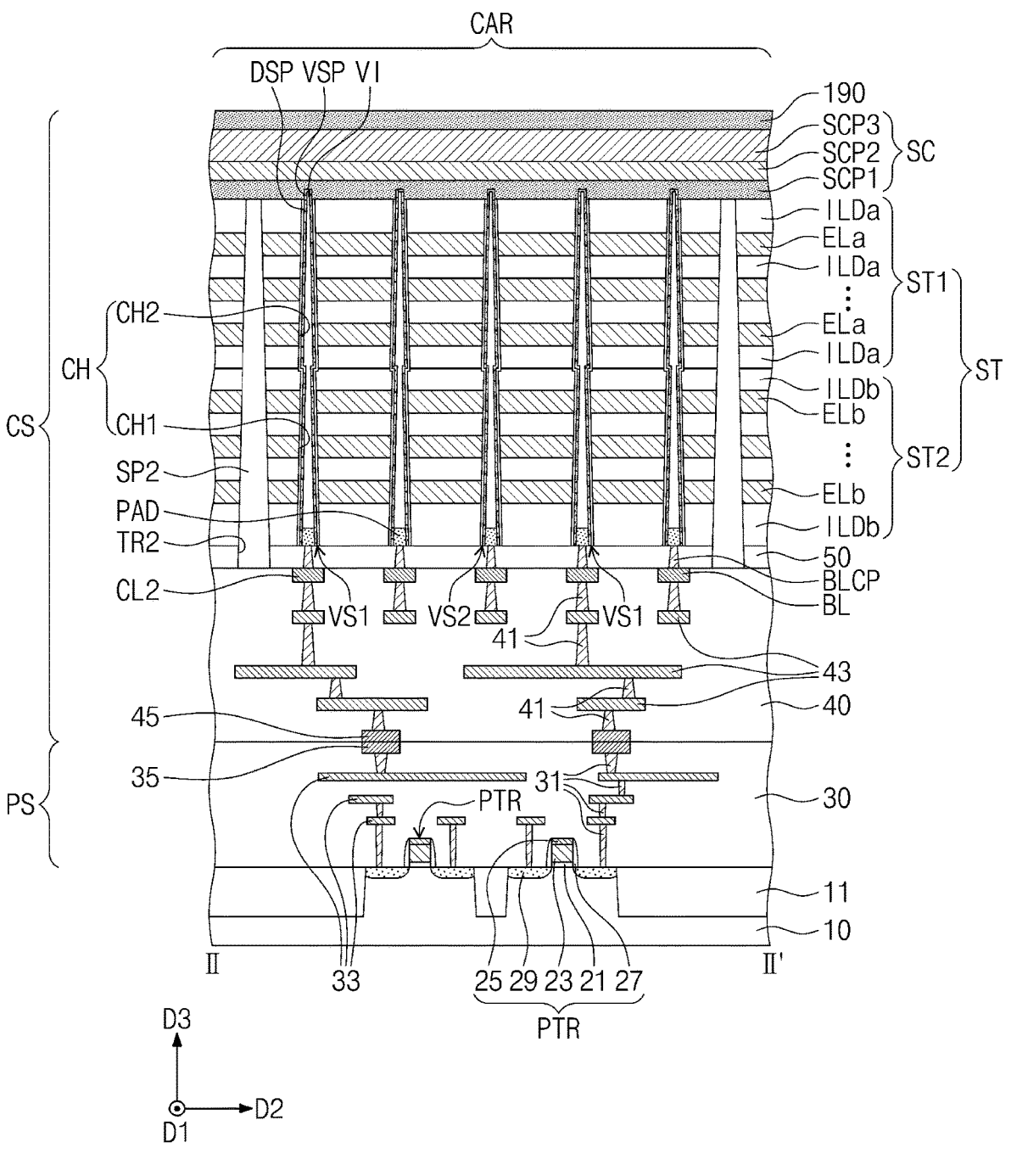
Figure 7A:
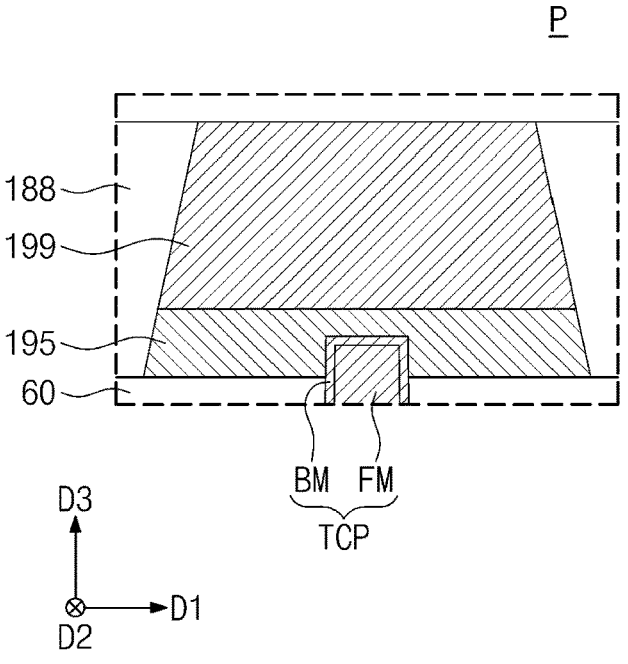
FIG. 7A is an enlarged view of part "P" of FIG. 6A.
Figure 7B:
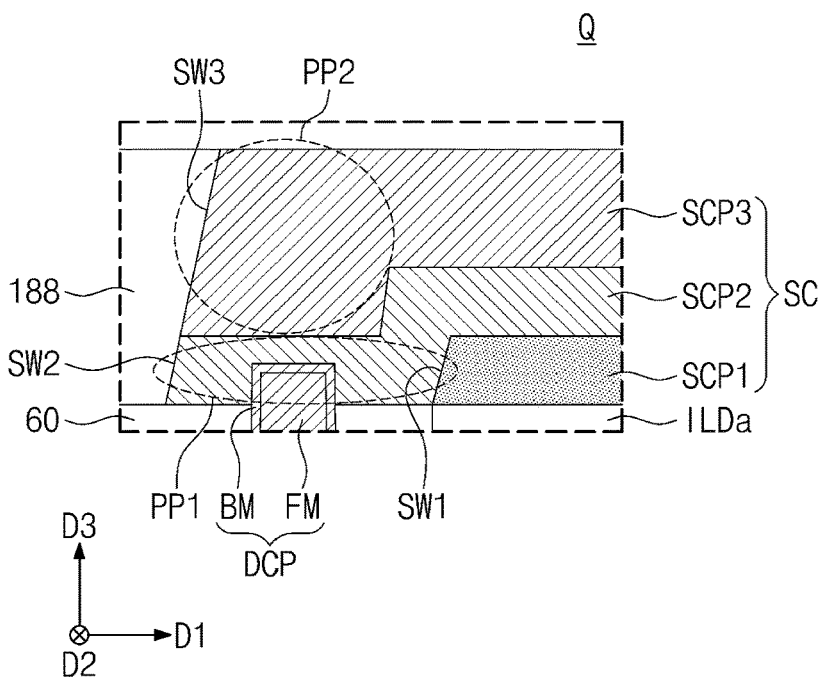
FIG. 7B is an enlarged view of part "Q" of FIG. 6A.
Figure 7C:
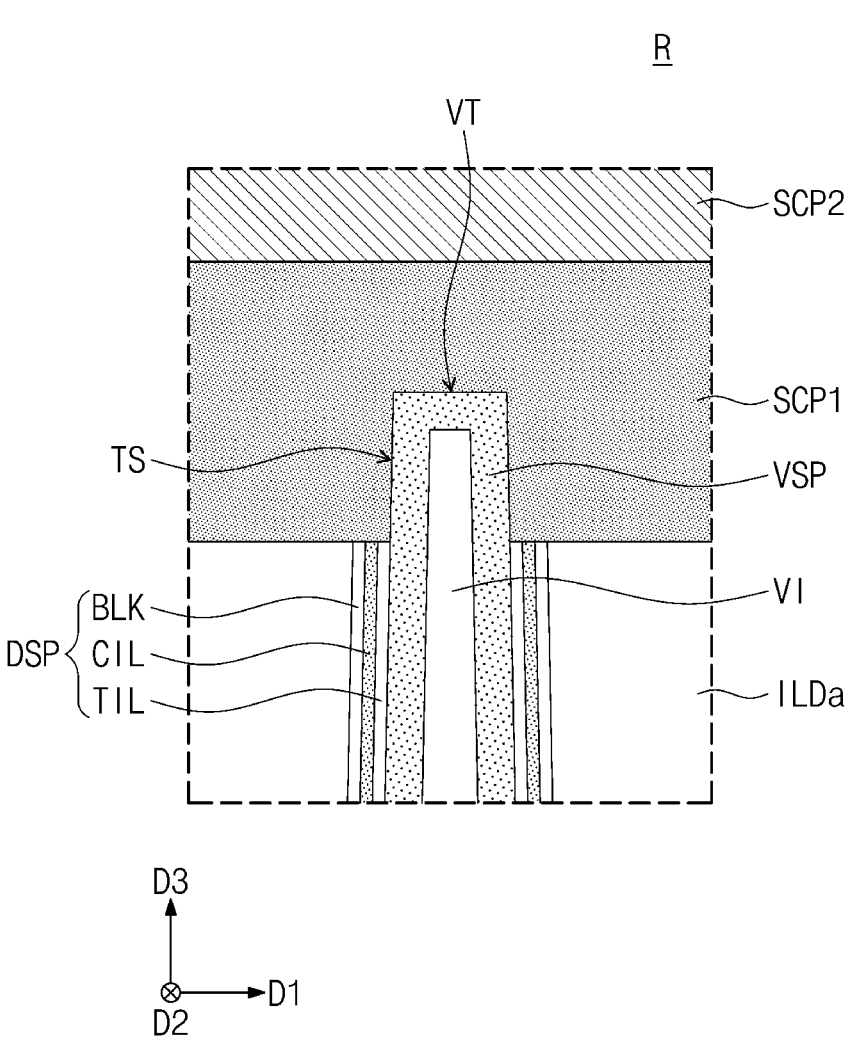
FIG. 7C is an enlarged view of part "R" of FIG. 6A.

FIG. 5 is a plan view illustrating a three-dimensional semiconductor memory device according to embodiments of the inventive concept. FIGS. 6A and 6B are cross-sectional views taken along lines I-I' and II-II' of FIG. 5, respectively, and illustrating a three-dimensional semiconductor memory device according to embodiments of the inventive concept. FIG. 7A is an enlarged view of part "P" of FIG. 6A. FIG. 7B is an enlarged view of part "Q" of FIG. 6A. FIG. 7C is an enlarged view of part "R" of FIG. 6A.

Referring to FIGS. 5, 6A, and 6B, a three-dimensional semiconductor memory device according to the inventive concept may include a substrate 10, a peripheral circuit structure PS on the substrate 10, and a cell array structure CS on the peripheral circuit structure PS. The substrate 10, the peripheral circuit structure PS, and the cell array structure CS may correspond to the semiconductor substrate 4010, the first structure 4100 on the semiconductor substrate 4010, and the second structure 4200 on the first structure 4100 in FIGS. 3 and 4, respectively.

The cell array structure CS may be coupled on the peripheral circuit structure PS, thereby increasing a cell capacity per unit area of the three-dimensional semiconductor memory device according to the inventive concept. In addition, each of the peripheral circuit structure PS and the cell array structure CS may be manufactured separately and coupled to each other later, and thus damage to peripheral transistors PTR due to various heat treatment processes may be prevented, thereby improving electrical characteristics and reliability of the three-dimensional semiconductor memory device according to the inventive concept.

The substrate 10 may be, for example, a silicon substrate, a silicon-germanium substrate, a germanium substrate, or a single crystal epitaxial layer grown on a monocrystalline silicon substrate. The substrate 10 may have a top surface that is parallel to a first direction D1 and a second direction D2 intersecting the first direction D1 and is perpendicular to a third direction D3. The first to third directions D1, D2, and D3 may be, for example, directions perpendicular to each other. A device isolation layer 11 may be provided in the substrate 10. The device isolation layer 11 may define an active region of the substrate 10.

The peripheral circuit structure PS including peripheral transistors PTR, peripheral contact plugs 31, peripheral circuit wirings 33 electrically connected to the peripheral transistors PTR through the peripheral contact plugs 31, first bonding pads 35 electrically connected to the peripheral circuit wirings 33, and a first interlayer insulating layer 30 surrounding them may be provide on the substrate 10. The peripheral transistors PTR may be provided on the active region of the substrate 10. The peripheral circuit wirings 33 may correspond to the peripheral circuit wirings 4110 of FIGS. 3 and 4, and the first bonding pads 35 may correspond to the first bonding pads 4150 of FIGS. 3 and 4.

For example, a width of the peripheral contact plugs 31 may increase in the first direction D1 or the second direction D2 toward the third direction D3. The peripheral contact plugs 31 and the peripheral circuit wirings 33 may include a conductive material such as metal.

The peripheral transistors PTR may constitute, for example, a decoder circuit (1110 of FIG. 1), a page buffer (1120 of FIG. 1), and a logic circuit (1130 of FIG. 1). In detail, each of the peripheral transistors PTR may include a peripheral gate insulating layer 21, a peripheral gate electrode 23, a peripheral capping pattern 25, a peripheral gate spacer 27, and peripheral source/drain regions 29. The peripheral gate insulating layer 21 may be provided between the peripheral gate electrode 23 and the substrate 10. The peripheral capping pattern 25 may be provided on the peripheral gate electrode 23. The peripheral gate spacer 27 may cover sidewalls of the peripheral gate insulating layer 21, the peripheral gate electrode 23, and the peripheral capping pattern 25. The peripheral source/drain regions 29 may be provided in the substrate 10 adjacent to both sides of the peripheral gate electrode 23. The peripheral circuit wirings 33 and the first bonding pads 35 may be electrically connected to the peripheral transistors PTR through the peripheral contact plugs 31. Each of the peripheral transistors PTR may be, for example, an NMOS transistor or a PMOS transistor.

The first interlayer insulating layer 30 may be provided on the substrate 10. The first interlayer insulating layer 30 may cover the peripheral transistors PTR, the peripheral contact plugs 31, and the peripheral circuit wirings 33 on the substrate 10. The first interlayer insulating layer 30 may include a plurality of insulating layers having a multilayer structure. For example, the first interlayer insulating layer 30 may include silicon oxide, silicon nitride, silicon oxynitride, and/or a low-k material. The first interlayer insulating layer 30 may not cover the top surfaces of the first bonding pads 35. A top surface of the first interlayer insulating layer 30 may be substantially coplanar with the top surfaces of the first bonding pads 35.

The cell array structure CS including second bonding pads 45, bit lines BL, a stack structure ST, and a second source conductive pattern SCP2 may be provided on the peripheral circuit structure PS. The cell array structure CS may include a cell array region CAR and a cell array contact region EXR. The cell array contact region EXR may extend in a direction opposite to the first direction D1 (or the first direction D1) from the cell array region CAR.

The second bonding pads 45, the bit lines BL, and the stack structure ST may correspond to the second bonding pads 4250, the bit lines 4240, and the gate stack structure 4210 of FIGS. 3 and 4. The second bonding pads 45 in contact with the first bonding pads 35 of the peripheral circuit structure PS, connection contact plugs 41, connection circuit wirings 43 electrically connected to the second bonding pads 45 through the connection contact plugs 41, and a second interlayer insulating layer 40 surrounding them may be provided on the first interlayer insulating layer 30.

The second interlayer insulating layer 40 may include a plurality of insulating layers having a multilayer structure. For example, the second interlayer insulating layer 40 may include silicon oxide, silicon nitride, silicon oxynitride, and/or a low-k material.

For example, a width of the connection contact plugs 41 in the first direction D1 or the second direction D2 may decrease in the third direction D3. The connection contact plugs 41 and the connection circuit wirings 43 may include a conductive material such as metal.

The second interlayer insulating layer 40 may not cover bottom surfaces of the second bonding pads 45. A bottom surface of the second interlayer insulating layer 40 may be substantially coplanar with the bottom surfaces of the second bonding pads 45. The bottom surface of each of the second bonding pads 45 may be in contact with the top surface of each of the first bonding pads 35. The first and second bonding pads 35 and 45 may include a metal such as copper (Cu), tungsten (W), aluminum (Al), nickel (Ni), or tin (Sn), but not limited thereto. The first and second bonding pads 35 and 45 may form an integral shape without an interface visible to the naked eye therebetween. Although sidewalls of the first and second bonding pads 35 and 45 are shown to be aligned to each other, the inventive concept is not limited thereto, and on a plane view, the sidewalls of the first and second bonding pads 35 and 45 may be spaced apart from each other.

The bit lines BL and first to third conductive lines CL1, CL2, and CL3 in contact with the connection contact plugs 41 may be provided on the second interlayer insulating layer 40. Each of the bit lines BL and the first to third conductive lines CL1, CL2, and CL3 may extend, for example, in the second direction D2 and may be spaced apart from each other in the first direction D1. The bit lines BL and the first to third conductive lines CL1, CL2, and CL3 may include a conductive material such as a metal.

A third interlayer insulating layer 50 may be provided on the second interlayer insulating layer 40. A fourth interlayer insulating layer 60 and the stack structure ST surrounded by the fourth interlayer insulating layer 60 may be provided on the third interlayer insulating layer 50. The third and fourth insulating layers 50 and 60 may include a plurality of insulating layers having a multilayer structure. For example, the third and fourth insulating layers 50 and 60 may include silicon oxide, silicon nitride, silicon oxynitride, and/or a low-k material.

Bit line contact plugs BLCP may be provided in the third interlayer insulating layer 50. The bit line contact plugs BLCP extend in the third direction D3 and may connect between the bit lines BL and first vertical channel structures VS1 to be described later.

Cell contact plugs CCP, a source contact plug DCP, and a through contact plug TCP passing through the third interlayer insulating layer 50 and the fourth interlayer insulating layer 60 may be provided. The cell contact plugs CCP extend in the third direction D3 and may connect between the first conductive lines CL1 and gate electrodes ELa and ELb of the stack structure ST to be described later. Each of the cell contact plugs CCP may pass through one of interlayer insulating layers ILDa and ILDb of the stack structure ST, which will be described later. The through contact plug TCP extends in the third direction D3 and may connect between the second conductive line CL2 and first and second rear conductive patterns 195 and 199 to be described later. The source contact plug DCP extends in the third direction D3 and may connect between the second source conductive pattern SCP2 and the third conductive line CL3 to be described below.

The bit line contact plugs BLCP, the cell contact plugs CCP, the source contact plug DCP, and the through contact plug TCP may be spaced apart from each other in the first direction D1. A width of each the bit line contact plugs BLCP, the cell contact plugs CCP, the source contact plug DCP, and the through contact plug TCP in the first direction D1 and/or the second direction D2 may decrease in the third direction D3. The bit line contact plugs BLCP may include a metal material such as tungsten. The cell contact plugs CCP, the source contact plug DCP, and the through contact plug TCP may include a conductive pattern FM and a barrier pattern BM surrounding the conductive pattern FM. For example, the conductive pattern FM may include a metal material such as aluminum, copper, tungsten, molybdenum, and/or cobalt. For example, the barrier pattern BM may include a metal layer/metal nitride layer. The metal layer may include, for example, titanium, tantalum, tungsten, nickel, cobalt, and/or platinum. The metal nitride layer may, for example, a titanium nitride layer (TiN), a tantalum nitride layer (TaN), a tungsten nitride layer (WN), a nickel nitride layer (NiN), a cobalt nitride layer (CoN), and/or a platinum nitride layer (PtN).

The stack structure ST may be provided on the third interlayer insulating layer 50. The stack structure ST may be surrounded by the fourth interlayer insulating layer 60. A bottom surface of the stack structure ST (i.e., a surface in contact with the third interlayer insulating layer 50) may be substantially coplanar with a bottom surface of the fourth interlayer insulating layer 60.

The stack structure ST may be provided in plurality. The plurality of stack structures ST may extend in the first direction D1 and may be spaced apart from each other in the second direction D2 on a plane view of FIG. 5. Hereinafter, a single stack structure ST will be described for convenience of description, but the following description may be equally applied to other stack structures ST.

The stack structure ST may include interlayer insulating layers and gate electrodes that are alternately and repeatedly disposed (stacked). The stack structure ST may have an inverted step shape including interlayer insulating layers and gate electrodes. As an example, the stack structure ST may include a first stack structure ST1 and a second stack structure ST2. The first stack structure ST1 may include first interlayer insulating layers ILDa and first gate electrodes ELa that are alternately stacked, and the second stack structure ST2 may include second interlayers insulating layers ILDb and second gate electrodes ELb that are alternately stacked.

The second stack structure ST2 may be provided between the first stack structure ST1 and the substrate 10. In detail, the second stack structure ST2 may be provided on a bottom surface of a bottommost one of first interlayer insulating layers ILDa of the first stack structure ST1. A topmost one of the second interlayer insulating layers ILDb of the second stack structure ST2 and the bottommost one of the first interlayer insulating layers ILDa of the first stack structure ST1 may be in contact with each other, but the inventive concept is not limited thereto, and a single-layered insulating layer may be provide between the topmost one of the second interlayer insulating layers ILDb of the second stack structure ST2 and the first gate electrodes ELa of the first stack structure ST1.

The first and second gate electrodes ELa and ELb may be simultaneously formed of the same material. The first and second gate electrodes ELa and ELb may include, for example, a doped semiconductor (e.g., doped silicon, etc.), a metal (e.g., tungsten, molybdenum, nickel, copper, aluminum, etc.), a conductive metal nitride. (e.g., titanium nitride, tantalum nitride, etc.) and/or a transition metal (e.g., titanium, tantalum, etc.). The first and second interlayer insulating layers ILDa and ILDb may include silicon oxide, silicon nitride, silicon oxynitride, and/or a low-k material. For example, the first and second interlayer insulating layers ILDa and ILDb may include high-density plasma oxide (HDP oxide) or tetraethylorthosilicate (TEOS).

In the cell array contact region EXR, each of the first and second stack structures ST1 and ST2 may decrease in thickness in the third direction D3 as a distance from an outer-most one of the first vertical channel structures VS1 to be described later increases. That is, each of the first and second stacked structures ST1 and ST2 may have an inverted step structure in the first direction D1.

In detail, lengths of the first gate electrodes ELa and the second gate electrodes ELb in the first direction D1 may increase as a distance from the substrate 10 increases. Sidewalls of the first and second gate electrodes ELa and ELb may be spaced apart from each other by a certain interval in the first direction D1, on a plane view according to FIG. 5. A bottommost one of the second gate electrodes ELb of the second stacked structure ST2 may have a smallest length in the first direction D1 and a topmost one of the first gate electrodes ELa may have a largest length in the first direction D1.

The first and second gate electrodes ELa and ELb may include pad parts ELp in the cell array contact region EXR. The pad parts ELp may be disposed at different positions horizontally and vertically. The pad parts ELp may have a step structure in the first direction D1. The above-described cell contact plugs CCP may pass through one of the first and second interlayer insulating layers ILDa and ILDb to make contact with the pad parts ELp of the first and second gate electrodes ELa and ELb. For example, the cell contact plugs CCP may be electrically connected to the first and second gate electrodes ELa and ELb and the first conductive lines CL1.

The first and second interlayer insulating layers ILDa and TLDb may be provided between the first and second gate electrodes ELa and ELb and may be aligned with one of the first and second gate electrodes ELa and ELb in contact with each of upper portions thereof. For example, a topmost one of the first interlayer insulating layers ILDa may be provided on a topmost one of the first gate electrodes ELa. A length in the first direction D1 of each of the first and second interlayer insulating layers ILDa and ILDb may increase as a distance from the substrate 10 increases. The topmost one of the first interlayer insulating layers ILDa may have a length in the first direction D1 which is identical to a length of the topmost one of the first gate electrodes Ela. A bottommost one of the second interlayer insulating layers TLDb may have a greater thickness in the third direction D3 than other interlayer insulating layers, but the present invention is not limited thereto. The topmost one of the first interlayer insulating layers ILDa may have a greater thickness in the third direction D3 than other interlayer insulating layers, but the present invention is not limited thereto.

In the cell array region CAR, first vertical channel structures VS1 and second vertical channel structures VS2 may be provided in the vertical channel holes CH passing through the stack structure ST in the third direction D3. The first vertical channel structures VS1 may correspond to the memory channel structures 4220 of FIGS. 3 and 4.

In the cell array contact region EXR, third vertical channel structures VS3 may be provided in vertical channel holes CH passing through at least a portion of the stack structure ST and the fourth interlayer insulating layer 60 in the third direction D3. As shown in FIG. 5, the third vertical channel structure VS3 may be formed in plurality around each of the source contact plug DCP or the cell contact plugs CCP.

The vertical channel holes CH may include first vertical channel holes CH1 and second vertical channel holes CH2 connected to the first vertical channel holes CH1. A width of each of the first and second vertical channel holes CH1 and CH2 in the first direction D1 or the second direction D2 may decrease as a distance from the substrate 10 increases. The first and second vertical channel holes CH1 and CH2 may have different diameters at a boundary where the first and second vertical channel holes CH1 and CH2 are connected to each other. In detail, an upper diameter of each of the second vertical channel holes CH2 may be smaller than a lower diameter of each of the first vertical channel holes CH1. Each of the first and second vertical channel holes CH1 and CH2 may have a step difference at the boundary thereof. However, the inventive concept is not limited thereto, and differently from that shown in FIGS. 5, 6A, and 6B, first to third vertical channel structures VS1, VS2, and VS3 may be provided in three or more vertical channel holes CH having a step difference at two or more boundaries, and first to third vertical channel structures VS1, VS2, and VS3 may be provided in vertical channel holes CH having flat sidewalls without a step difference.

Referring to FIGS. 6B and 7C, each of the first to third vertical channel structures VS1, VS2, and VS3 may include a conductive pad PAD adjacent to the third interlayer insulating layer 50, a data storage pattern DSP conformally disposed on (e.g., covering) inner sidewalls of each of the first and second vertical channel holes CH1 and CH2, a vertical semiconductor pattern VSP conformally disposed on (e.g., covering) a sidewall of the data storage pattern DSP, and a buried insulating pattern VI filling an inner space of each of the first and second vertical channel holes CH1 and CH2 surrounded by the vertical semiconductor pattern VSP and the conductive pad PAD. The vertical semiconductor pattern VSP may be surrounded by the data storage pattern DSP (e.g., the data storage pattern DSP may be on outer walls of the vertical semiconductor pattern VSP). A bottom surface of each of the first to third vertical channel structures VS1, VS2, and VS3 may have, for example, a circular, oval, or bar shape.

The vertical semiconductor pattern VSP may be provided between the data storage pattern DSP and the buried insulating pattern VI and between the data storage pattern DSP and the conductive pad PAD. The vertical semiconductor pattern VSP may have a pipe shape with a closed top or a macaroni shape. The vertical semiconductor pattern VSP may include, for example, a semiconductor material doped with an impurity, an intrinsic semiconductor material in an undoped state, or a polycrystalline semiconductor material. The conductive pad PAD may include, for example, a semiconductor material doped with impurities or a conductive material.

On a plane view of FIG. 5, a first trench TR1 and a second trench TR2 extending in the first direction D1 and crossing the stack structure ST may be provided. The first trench TR1 may be provided in the cell array region CAR, and the second trench TR2 may extend from the cell array region CAR toward the cell array contact region EXR. Widths of the first and second trenches TR1 and TR2 in the first direction D1 or the second direction D2 may decrease as a distance from the substrate 10 increases.

A first separation pattern SP1 and a second separation pattern SP2 may be provided to fill the inside of each of the first and second trenches TR1 and TR2. The first and second separation patterns SP1 and SP2 may correspond to the separation structures 4230 of FIGS. 3 and 4. A length of the second separation pattern SP2 in the first direction D1 may be greater than a length of the first separation pattern SP1 in the first direction D1. Sidewalls of the first and second separation patterns SP1 and SP2 may be in contact with at least some of the first and second gate electrodes ELa and ELb and the first and second interlayer insulating layers ILDa and TLDb of the stack structure ST. The first and second separation patterns SP1 and SP2 may include, for example, an oxide such as silicon oxide.

A bottom surface of the second separation pattern SP2 may be substantially coplanar with a bottom surface of the third interlayer insulating layer 50 (i.e., the top surface of the second interlayer insulating layer 40) and top surfaces of the bit lines BL and the first and second conductive lines CL1, CL2. A top surface of the second separation pattern SP2 may be positioned at a lower level than top surfaces of the first to third vertical channel structures VS1, VS2, and VS3, relative to the substrate 10.

When the stack structure ST is provided in plurality, the first separation pattern SP1 or the second separation pattern SP2 may be provided between the stack structures ST arranged in the second direction D2. In other words, the stack structures ST may be spaced apart from each other in the second direction D2 with the first separation pattern SP1 or the second separation pattern SP2 interposed therebetween.

A first source conductive pattern SCP1, a second source conductive pattern SCP2, and a third source conductive pattern SCP3 may be sequentially stacked on the stack structure ST. The first to third source conductive patterns SCP1, SCP2, and SCP3 may together constitute the source structure SC. The source structure SC may correspond to the common source line 4205 of FIGS. 3 and 4.

The first source conductive pattern SCP1 may be provided on a topmost one of the first interlayer insulating layers ILDa. The third source conductive pattern SCP3 may be provided on the first source conductive pattern SCP1. The second source conductive pattern SCP2 may be interposed between the first source conductive pattern SCP1 and the third source conductive pattern SCP3. The first to third source conductive patterns SCP1, SCP2, and SCP3 may extend from the cell array region CAR to the cell array contact region EXR. The first to third source conductive patterns SCP1, SCP2, and SCP3 may be electrically connected to each other.

The first to third source conductive patterns SCP1, SCP2, and SCP3 may include different materials. The first source conductive pattern SCP1 may include doped polycrystalline silicon. In detail, the first source conductive pattern SCP1 may be a polycrystalline silicon layer doped with an n-type dopant. The second source conductive pattern SCP2 may include, for example, tungsten and/or tungsten nitride. The third source conductive pattern SCP3 may include a metal such as aluminum.

As illustrated in FIGS. 6A and 7B, the first source conductive pattern SCP1 may have a first sidewall SW1 in the cell array contact region EXR. The first sidewall SW1 may have a non-vertical inclination, but the inventive concept is not limited thereto. The second source conductive pattern SCP2 may extend onto the first sidewall SW1 to have a first protrusion PP1 in the cell array contact region EXR. The second source conductive pattern SCP2 may cover the first sidewall SW1. The first protrusion PP1 of the second source conductive pattern SCP2 may have a second sidewall SW2. The third source conductive pattern SCP3 may extend onto the first protrusion PP1 to have the second protrusion PP2 in the cell array contact region EXR. The second protrusion PP2 may have a third sidewall SW3. The second sidewall SW2 and the third sidewall SW3 may have a non-vertical inclination, but the inventive concept is not limited thereto. The second sidewall SW2 and the third sidewall SW3 may be aligned with each other.

As illustrated in FIGS. 6A and 7B, a top surface of a source contact plug DCP may be in contact with the second source conductive pattern SCP2. The source contact plug DCP may partially penetrate the second source conductive pattern SCP2. The source contact plug DCP may be spaced apart from the third source conductive pattern SCP3. (e.g., a top surface of the source contact plug DCP is lower than a bottom surface of the second protrusion PP2 of the third source conductive pattern SCP3, relative to the substrate 10). The top surface of the source contact plug DCP may be lower than a top surface of the first source conductive pattern SCP1, relative to the substrate 10. The source contact plug DCP may be electrically connected to the first source conductive pattern SCP1 through the second source conductive pattern SCP2 and the third source conductive pattern SCP3.

The second source conductive pattern SCP2 may be in contact with the top surface of the first source conductive pattern SCP1. The first source conductive pattern SCP1 may be in contact with top surfaces of the second separation patterns SP2 (Referring to FIG. 6B). First to third vertical channel structures VS1, VS2, and VS3 may penetrate the stack structure ST and be extended into a lower portion of the first source conductive pattern SCP1 (e.g., lower than the center level of the first source conductive pattern SCP1).

For example, a thickness of the first source conductive pattern SCP1 may be 50 Å to 150 Å. For example, a thickness of the third source conductive pattern SCP3 may be greater than a thickness of the second source conductive pattern SCP2. The thickness of the second source conductive pattern SCP2 may be 50 Å to 500 Å, and the thickness of the third source conductive pattern SCP3 may be 3000 Å to 4000 Å.

As illustrated in FIGS. 6A, 6B and 7C, a data storage pattern DSP may have an open top, and a vertical semiconductor pattern VSP may protrude into the first source conductive pattern SCP1 from the top surface of the data storage pattern DSP. That is, a top surface VT of the vertical semiconductor pattern VSP may be higher than the top surface of the data storage pattern DSP, relative to the substrate 10, and a upper sidewall TS and the top surface VT of the vertical semiconductor pattern VSP may be in contact with the first source conductive pattern SCP1.

An impurity concentration of the first source conductive pattern SCP1 may be higher than an impurity concentration of the data storage pattern DSP. The data storage pattern DSP may extend between a topmost one of the first interlayer insulating layers ILDa and the vertical semiconductor pattern VSP. The first vertical channel structures VS1 may be electrically connected to the second source conductive pattern SCP2 and the third source conductive pattern SCP3 through the first source conductive pattern SCP1.

As illustrated in FIGS. 6A and 7A, a fifth interlayer insulating layer 188 may be provided on the fourth interlayer insulating layer 60. A first rear conductive pattern 195 and a second rear conductive pattern 199 connected to the through contact plug TCP and sequentially stacked may be provided in the fifth interlayer insulating layer 188. The through contact plug TCP may partially penetrate the first rear conductive pattern 195. The through contact plug TCP may be spaced apart from the second rear conductive pattern 199. The first and second rear conductive patterns 195 and 199 may be electrically connected to the second conductive line CL2 through the through contact plug TCP, and further, may be electrically connected to at least one of the peripheral transistors PTR of the peripheral circuit structure PS. The first and second rear conductive patterns 195 and 199 may be combined to correspond to one of the input/output pad 1101 of FIG. 1 or the input/output pad 2210 of FIGS. 3 and 4. Alternatively, the first and second rear conductive patterns 195 and 199 may be a part of the rear surface metal wirings.

A level of a bottom surface of the first rear conductive pattern 195 and a level of the bottommost surface of the second source conductive pattern SCP2 may be substantially equal to each other, relative to the substrate 10. A top surface of the second rear conductive pattern 199 may be substantially at a same level as the top surface of the third source conductive pattern SCP3, relative to the substrate 10. The top surface of the second rear conductive pattern 199, the top surface of the fifth interlayer insulating layer 188, and the top surface of the third source conductive pattern SCP3 may be coplanar with each other. A top surface of the through contact plug TCP may be lower than the top surface of the first source conductive pattern SCP1, relative to the substrate 10.

The first rear conductive pattern 195 may include, for example, tungsten and/or tungsten nitride. The second rear conductive pattern 199 may include a metal such as aluminum.

The data storage pattern DSP may include a blocking insulating layer BLK, a charge storage layer CIL, and a tunneling insulating layer TIL sequentially stacked on a sidewall of a vertical channel hole CH. The blocking insulating layer BLK may be adjacent to the stack structure ST or the source structure SC, and the tunneling insulating layer TIL may be adjacent to the vertical semiconductor pattern VSP. The charge storage layer CIL may be interposed between the blocking insulating layer BLK and the tunneling insulating layer TIL. The blocking insulating layer BLK, the charge storage layer CIL, and the tunneling insulating layer TIL may extend in the third direction D3 between the stack structure ST and the vertical semiconductor pattern VSP. Fowler-Nordheim tunneling phenomenon induced by a voltage difference between the vertical semiconductor pattern VSP and the first and second gate electrodes ELa and ELb may allow the data storage pattern DSP to store and/or change data. For example, the blocking insulating layer BLK and the tunneling insulating layer TIL may include silicon oxide, and the charge storage layer CIL may include silicon nitride or silicon oxynitride.

A sixth interlayer insulating layer 190 may be provided on the fifth interlayer insulating layer 188. The sixth interlayer insulating layer 190 may cover the top surface of the third source conductive pattern SCP3 and a top surface of the fifth interlayer insulating layer 188. The sixth interlayer insulating layer 190 may include an opening OP exposing a top surface of the second rear conductive pattern 199. For example, the sixth interlayer insulating layer 190 may include silicon oxide.

According to embodiments, the second source conductive pattern SCP2 may be disposed between the first source conductive pattern SCP1 and the third source conductive pattern SCP3. Accordingly, a phenomenon in which the third source conductive pattern SCP3 diffuses into the first source conductive pattern SCP1 and a void is formed in the third source conductive pattern SCP3 may be prevented. In addition, the second source conductive pattern and the third source conductive pattern may be provided on the first source conductive pattern SCP1, and thus a thickness of the common source line CSL may be increased, thereby decreasing noise of the common source line CSL. Accordingly, electrical characteristics and reliability of the three-dimensional semiconductor memory device may be improved.

FIGS. 8A, 11A, 12A, 13A, and 14A are cross-sectional views taken along line I-I' of FIG. 5 and illustrating a method of manufacturing a three-dimensional semiconductor memory device according to embodiments of the inventive concept. FIGS. 8B, 111B, 12B, 13B, and 14B are cross-sectional views taken along line II-II' of FIG. 5, illustrating a method of manufacturing a three-dimensional semiconductor memory device according to embodiments of the inventive concept.

Figure 9A:
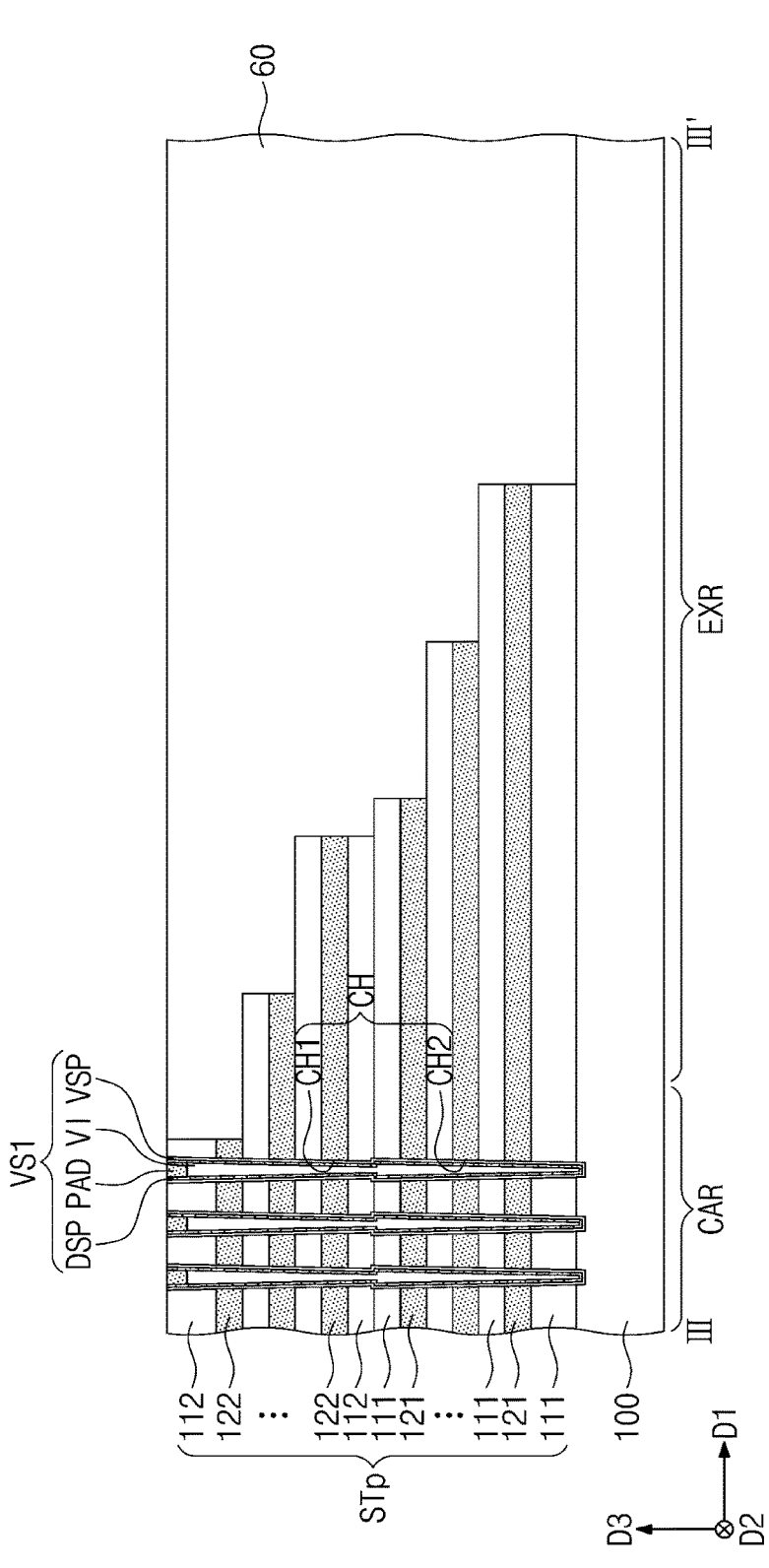
FIGS. 9A and 10A are cross-sectional views taken along line III-III' of FIG. 5, illustrating a method of manufacturing a three-dimensional semiconductor memory device according to embodiments of the inventive concept.
Figure 9B:
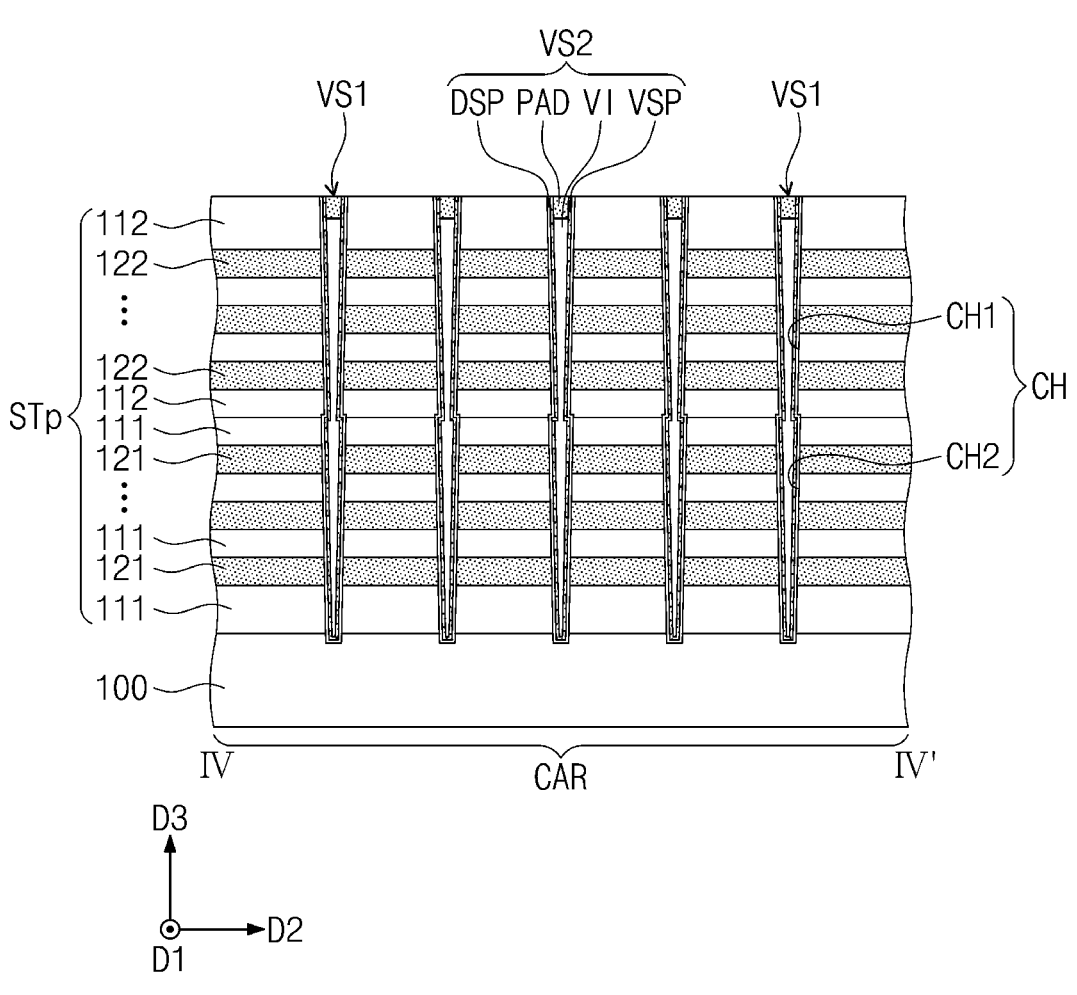
FIGS. 9B and 10B are cross-sectional views taken along line IV-IV' of FIG. 5, illustrating a method of manufacturing a three-dimensional semiconductor memory device according to embodiments of the inventive concept.
Figure 10A:
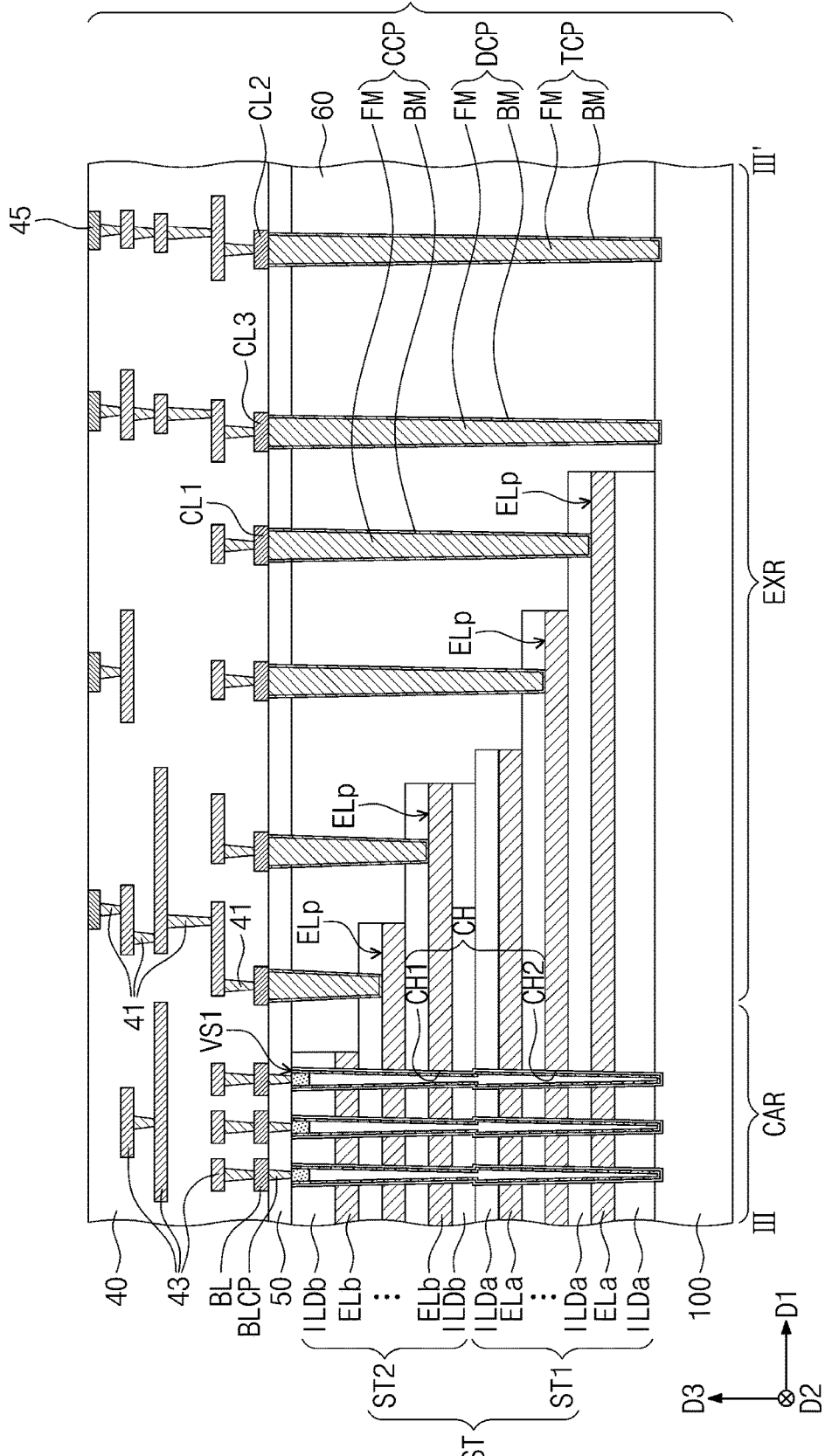
Figure 10B:
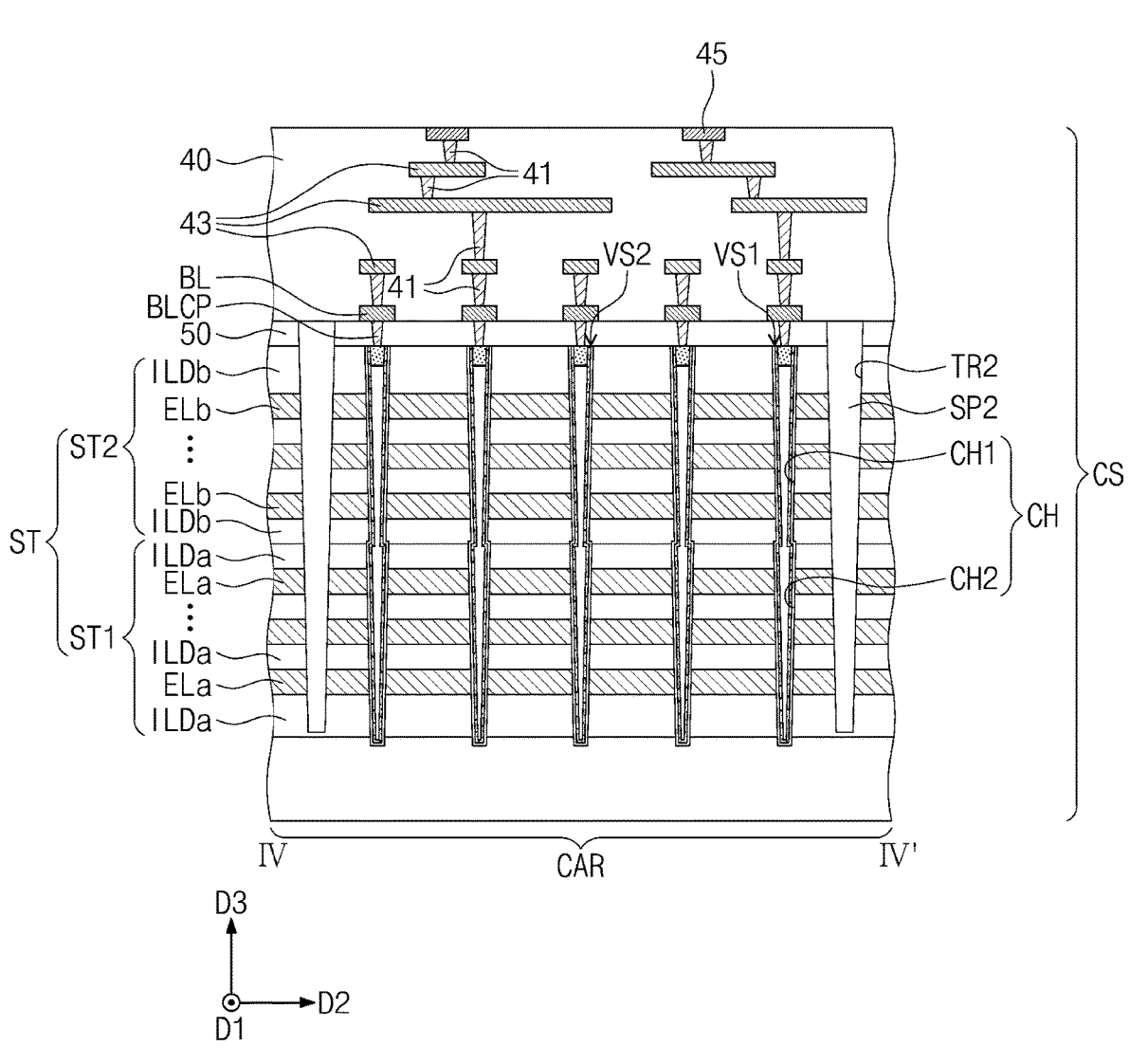

FIGS. 9A and 10A are cross-sectional views taken along line III-III' of FIG. 5, illustrating a method of manufacturing a three-dimensional semiconductor memory device according to embodiments of the inventive concept. FIGS. 9B and 10B are cross-sectional views taken along line IV-IV' of FIG. 5, illustrating a method of manufacturing a three-dimensional semiconductor memory device according to embodiments of the inventive concept.

Figure 8A:
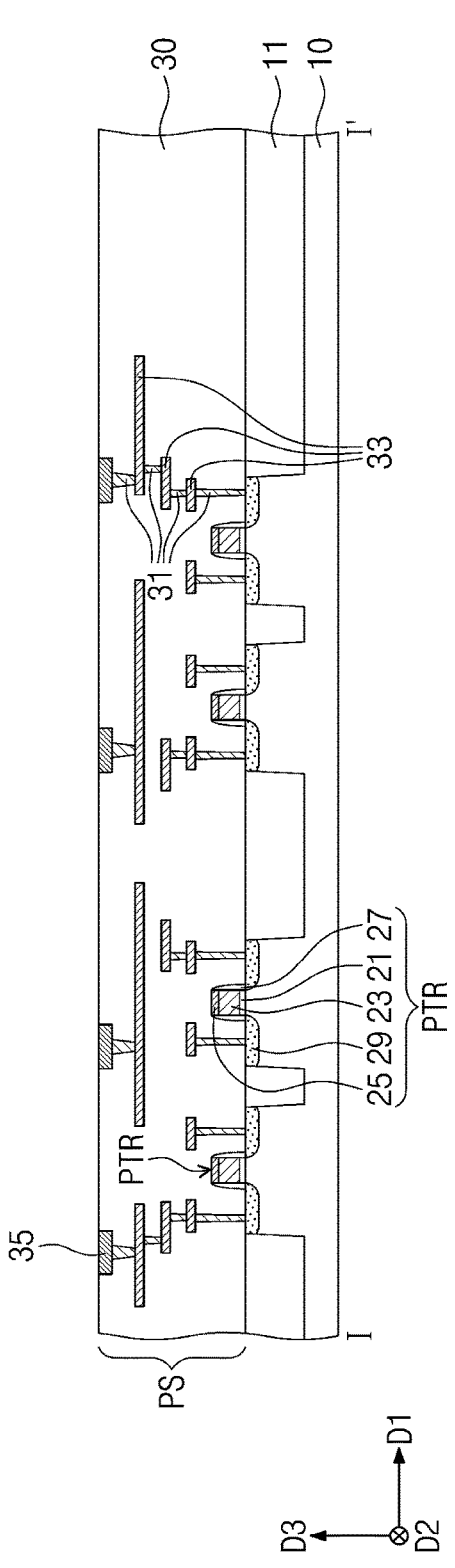
FIGS. 8A, 11A, 12A, 13A, and 14A are cross-sectional views taken along line I-I' of FIG. 5 and illustrating a method of manufacturing a three-dimensional semiconductor memory device according to embodiments of the inventive concept.
Figure 8B:
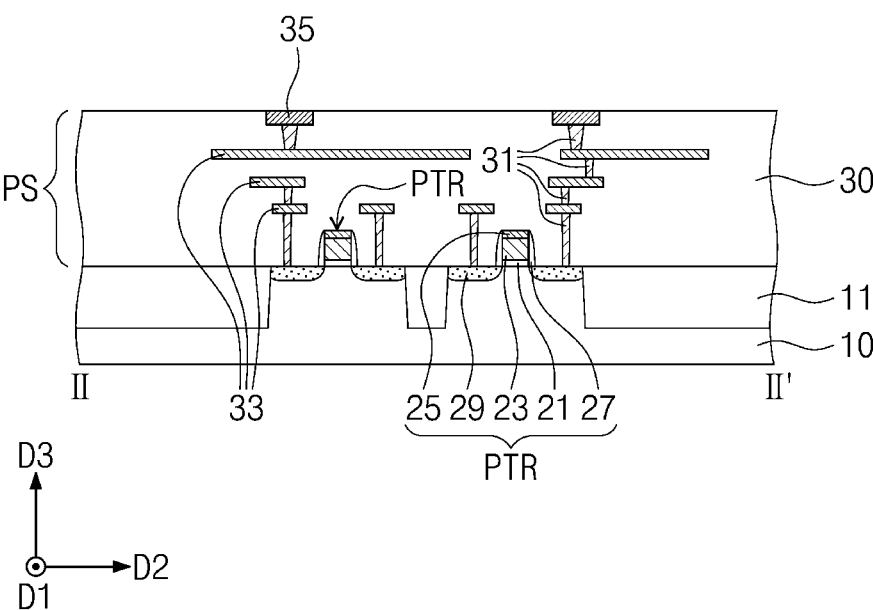

Referring to FIGS. 8A and 8B, a peripheral circuit structure PS may be formed on a substrate 10. Forming the peripheral circuit structure PS may include forming a device isolation layer 11 inside the substrate 10, forming peripheral transistors PTR on the active region of the substrate 10 defined by the device isolation layer 11, and forming peripheral contact plugs 31 electrically connected to the peripheral transistors PTR, peripheral circuit wirings 33, first bonding pads 35, and a first interlayer insulating layer 30 covering them.

Top surfaces of the first bonding pads 35 may be substantially coplanar with a top surface of the first interlayer insulating layer 30. Hereinafter, "substantially coplanar" means that a planarization process may be performed. The planarization process may be performed, for example, through a chemical mechanical polishing (CMP) process or an etch back process.

Referring to FIGS. 9A and 9B, a carrier substrate 100 may be provided. The carrier substrate 100 may be, for example, a silicon substrate, a silicon-germanium substrate, a germanium substrate, or a single crystal epitaxial layer grown on a monocrystalline silicon substrate.

First interlayer insulating layers 111 and first sacrificial layers 121 may be alternately stacked on the carrier substrate 100. Thereafter, first vertical channel holes CH1 passing through the first interlayer insulating layers 111 and the first sacrificial layers 121 may be formed, and sacrificial layers may be filled in the first vertical channel holes CH1. The first vertical channel holes CH1 may partially penetrate the carrier substrate 100.

Second interlayer insulating layers 112 and second sacrificial layers 122 may be alternately stacked on the first vertical channel holes CH1. The first and second sacrificial layers 121 and 122 may be formed of an insulating material different from an insulating material of the first and second interlayer insulating layers 111 and 112. The first and second sacrificial layers 121 and 122 may be formed of a material that capable of being etched with etch selectivity with respect to the first and second interlayer insulating layers 111 and 112. For example, the first and second sacrificial layers 121 and 122 may be formed of silicon nitride, and the first and second interlayer insulating layers 111 and 112 may be formed of silicon oxide. Each of the first and second sacrificial layers 121 and 122 may have substantially the same thickness, and the first and second interlayer insulating layers 111 and 112 may have different thicknesses in some regions.

Thereafter, second vertical channel holes CH2 may be formed through the second interlayer insulating layers 112 and the second sacrificial layers 122 to expose the sacrificial layers in the first vertical channel holes CH1. The second vertical channel holes CH2 may overlap the first vertical channel holes CH1 in a third direction D3 and may be connected to the first vertical channel holes CH1 to form the vertical channel holes CH. After the sacrificial layers exposed by the second vertical channel holes CH2 are removed, vertical channel structures VS1, VS2, and VS3 may be formed in the vertical channel holes CH. Accordingly, a preliminary stack structure STp may be formed through forming a data storage pattern DSP and a vertical semiconductor pattern VSP conformally disposed on (covering) inner sidewalls of each of the vertical channel holes CH, forming a buried insulating pattern VI in a space surrounded by the vertical semiconductor pattern VSP (e.g., the buried insulating pattern VI may be on inner walls of the vertical semiconductor pattern VSP), and forming a conductive pad PAD in a space surrounded by the buried insulating pattern VI and the data storage pattern DSP. Top surfaces of the first to third vertical channel structures VS1, VS2, and VS3 may be substantially coplanar with a top surface of a topmost one of the second interlayer insulating films 112 and a top surface of the fourth interlayer insulating film 60.

A trimming process may be performed on the preliminary stack structure STp including the alternately stacked first and second interlayer insulating layers 111 and 112 and the first and second sacrificial layers 121 and 122. The trimming process may include forming a mask pattern covering a portion of the top surface of the preliminary stack structure STp in a cell array region CAR and a cell array contact region EXR, patterning the preliminary stack structure STp through the mask pattern, reducing the area of the mask pattern, and patterning the preliminary stack structure STp through the mask pattern having the reduced area. The reducing of the area of the mask pattern and the patterning of the preliminary stack structure STp through the mask pattern may be alternately repeated. The trimming process may allow at least a portion of each of the first and second interlayer insulating layers 111 and 112 to exposed to the outside, and may allow a step structure of the preliminary stack structure STp to be formed in the cell array contact region EXR. The step structure of the preliminary stack structure STp may expose a portion of the top surface of the carrier substrate 100. Thereafter, a fourth interlayer insulating layer 60 covering the step structure of the preliminary stack structure STp may be formed. For example, the fourth interlayer insulating layer 60 may include silicon oxide.

Referring to FIGS. 5, 10A and 10B, a third interlayer insulating layer 50 covering a top surface of the fourth interlayer insulating layer 60 may be formed. First and second trenches TR1 and TR2 passing through at least a portion of the third interlayer insulating layer 50 and the preliminary stack structure STp may be formed. The first and second trenches TR1 and TR2 may extend from the cell array region CAR to the cell array contact region EXR. A depth of the first trench TR1 may be smaller than a depth of the second trench TR2. A bottom surface of the first trench TR1 may be positioned at a higher level than a top surface of a topmost one of the first interlayer insulating layers 111. A bottom surface of the second trench TR2 may be positioned at a higher level than bottom surfaces of the first to third vertical channel structures VS1, VS2, and VS3.

The first and second sacrificial layers 121 and 122 exposed by the first and second trenches TR1 and TR2 may be removed. The removing of the first and second sacrificial layers 121 and 122 may be performed through, for example, a wet etching process using a hydrofluoric acid (HF) and/or phosphoric acid (H3PO4) solution.

First and second gate electrodes ELa and ELb may be formed to fill spaces in which the first and second sacrificial layers 121 and 122 are removed. The first and second interlayer insulating layers 111 and 112 may be referred to as first and second interlayer insulating layers ILDa and TLDb of the first and second stack structures ST1 and ST2, and as a result, a stack structure ST including the first and second interlayer insulating layers ILDa and TLDb and the first and second gate electrodes ELa and ELb may be formed.

A first separation pattern SP1 filling the first trench TR1 and a second separation pattern SP2 filling the second trench TR2 may be formed. Top surfaces of the first and second separation patterns SP1 and SP2 may be substantially coplanar with a top surface of the third interlayer insulating layer 50.

In the cell array contact region EXR, the bit line contact plugs BLCP in contact with top surface of the first and second vertical channel structures VS1 and VS2 may be formed through the third interlayer insulating layer 50. Cell contact plugs CCP may be formed through the third and fourth insulating layers 50 and 60 to be in contact with pad parts ELp of the first and second gate electrodes ELa and ELb in the cell array contact region EXR. The cell contact plugs CCP may pass through at least a portion of the first and second interlayer insulating layers ILDa and ILDb. A source contact plug DCP passing through the third and fourth insulating layers 50 and 60 may be formed in the cell array contact region EXR. The source contact plug DCP may further penetrate a portion of the carrier substrate 100. A through contact plug TCP passing through the third and fourth insulating layers 50 and 60 may be formed in the cell array contact region EXR. The through contact plug DCP may further penetrate a portion of the carrier substrate 100.

Some of the cell contact plugs CCP, the source contact plug DCP, and the through contact plug TCP may be formed together. The forming of the cell contact plugs CCP, the source contact plug DCP, and the through contact plug TCP may include an etching process for forming high aspect ratio holes penetrating the third and fourth insulating layers 50 and 60.

Bit lines BL in contact with the bit line contact plugs BLCP may be formed on the third interlayer insulating layer 50 in the cell array region CAR. First to third conductive lines CL1, CL2, and CL3 may be formed on the third interlayer insulating layer 50 in the cell array contact region EXR.

On the third interlayer insulating layer 50, connection contact plugs 41 electrically connected to the bit lines BL and the first and second conductive lines CL1 and CL2, connection circuit wirings 43, second bonding pads 45, and a second interlayer insulating layer 40 covering them may be formed. Top surfaces of the second bonding pads 45 may be substantially coplanar with a top surface of the second interlayer insulating layer 40. Accordingly, the cell array structure CS may be formed on the carrier substrate 100.

Figure 11A:
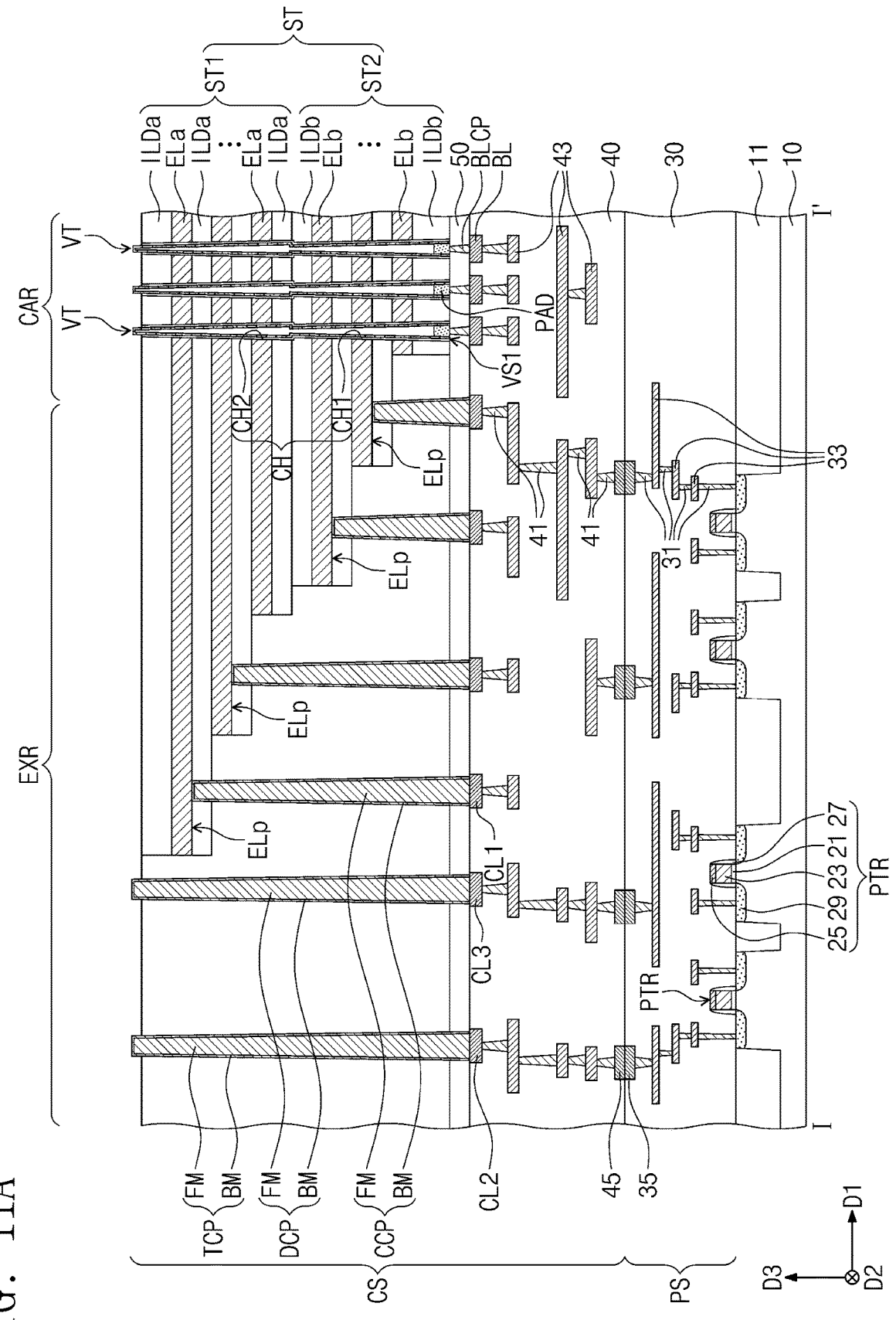
Figure 11B:
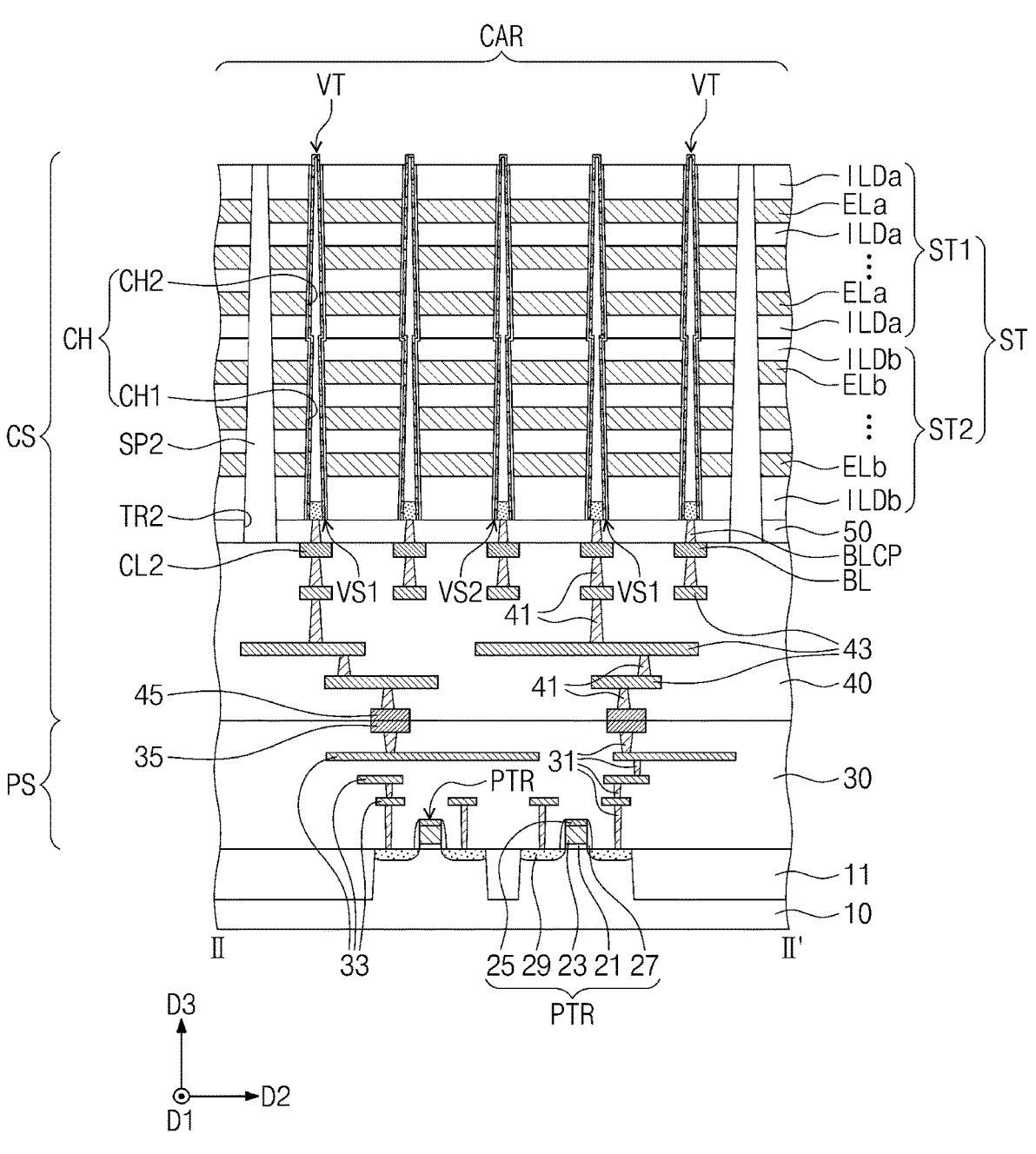

Referring to FIGS. 11A and 111B, a peripheral circuit structure PS formed on a substrate 10 may be coupled to the cell array structure CS formed on the carrier substrate 100 by the method described with reference to FIGS. 8A and 8B. In detail, the cell array structure CS may be attached on the peripheral circuit structure PS such that a first surface of the substrate 10 on which the peripheral circuit structure PS is formed faces to a first surface of the carrier substrate 100 on which the cell array structure CS is formed.

The carrier substrate 100 may be provided on the substrate 10 such that the cell array structure CS and the peripheral circuit structure PS face each other. First bonding pads 35 of the peripheral circuit structure PS may be fused with second bonding pads 45 of the cell array structure CS to be in contact with each other. After the first and second bonding pads 35 and 45 are bonded to each other, the carrier substrate 100 may be removed. For example, the removal of the carrier substrate 100 may include a planarization process, a dry etching process, and a wet etching process that are sequentially performed. When the carrier substrate 100 is removed, the data storage patterns DSP of the first vertical channel structures VS1 may protrude onto the topmost one of the first interlayer insulating layers ILDa.

Then, upper portions of the data storage patterns DSP protruding from the topmost one of the first interlayer insulating layers ILDa may be removed to expose top surfaces VT of the vertical semiconductor patterns VSP. A portion of the topmost one of the first interlayer insulating layers ILDa may be removed while exposing the vertical semiconductor patterns VSP. When the carrier substrate 100 is removed, an upper portion of the through contact plug TCP and an upper portion of the source contact plug DCP may be exposed.

Figure 12A:
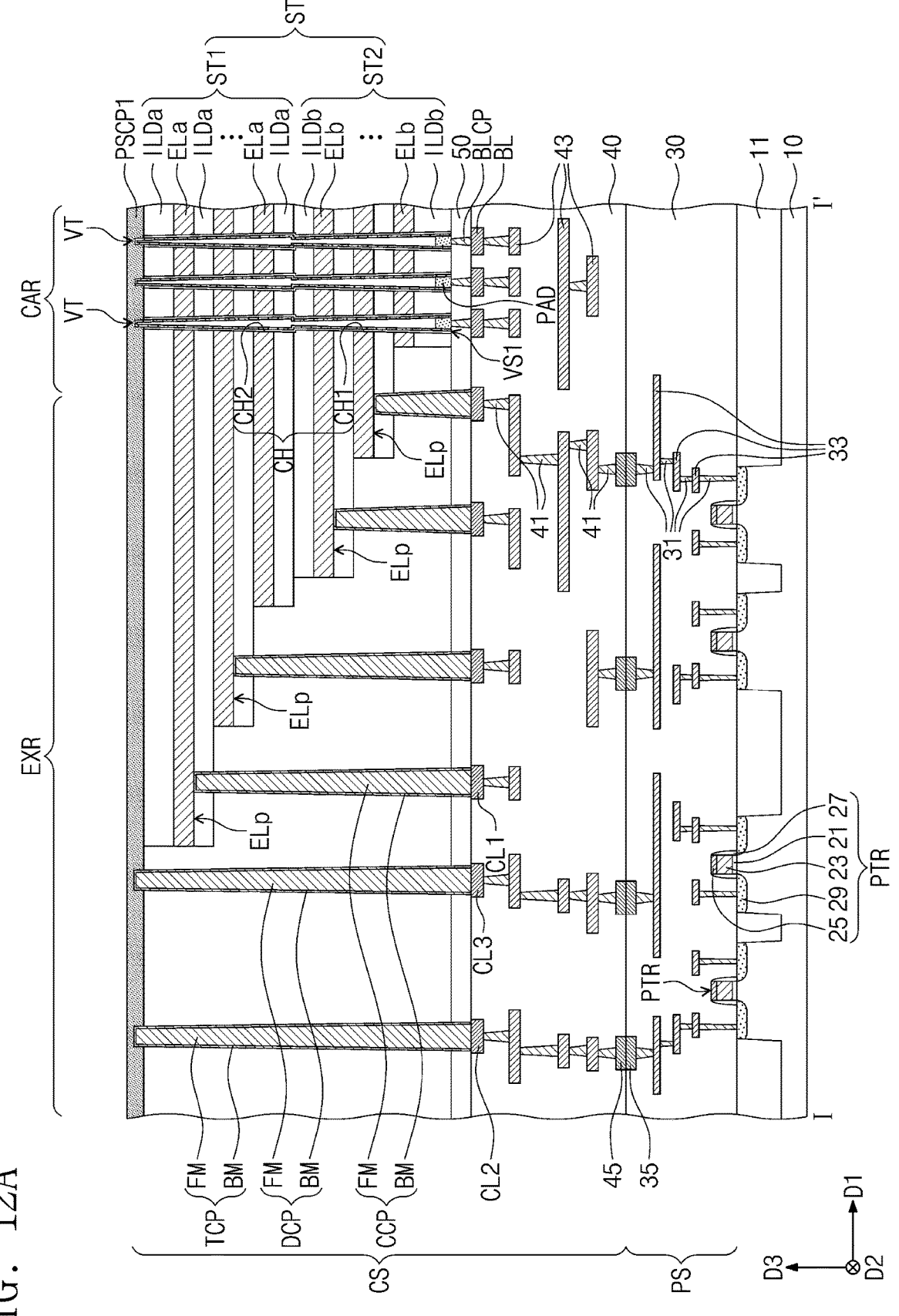
Figure 12B:
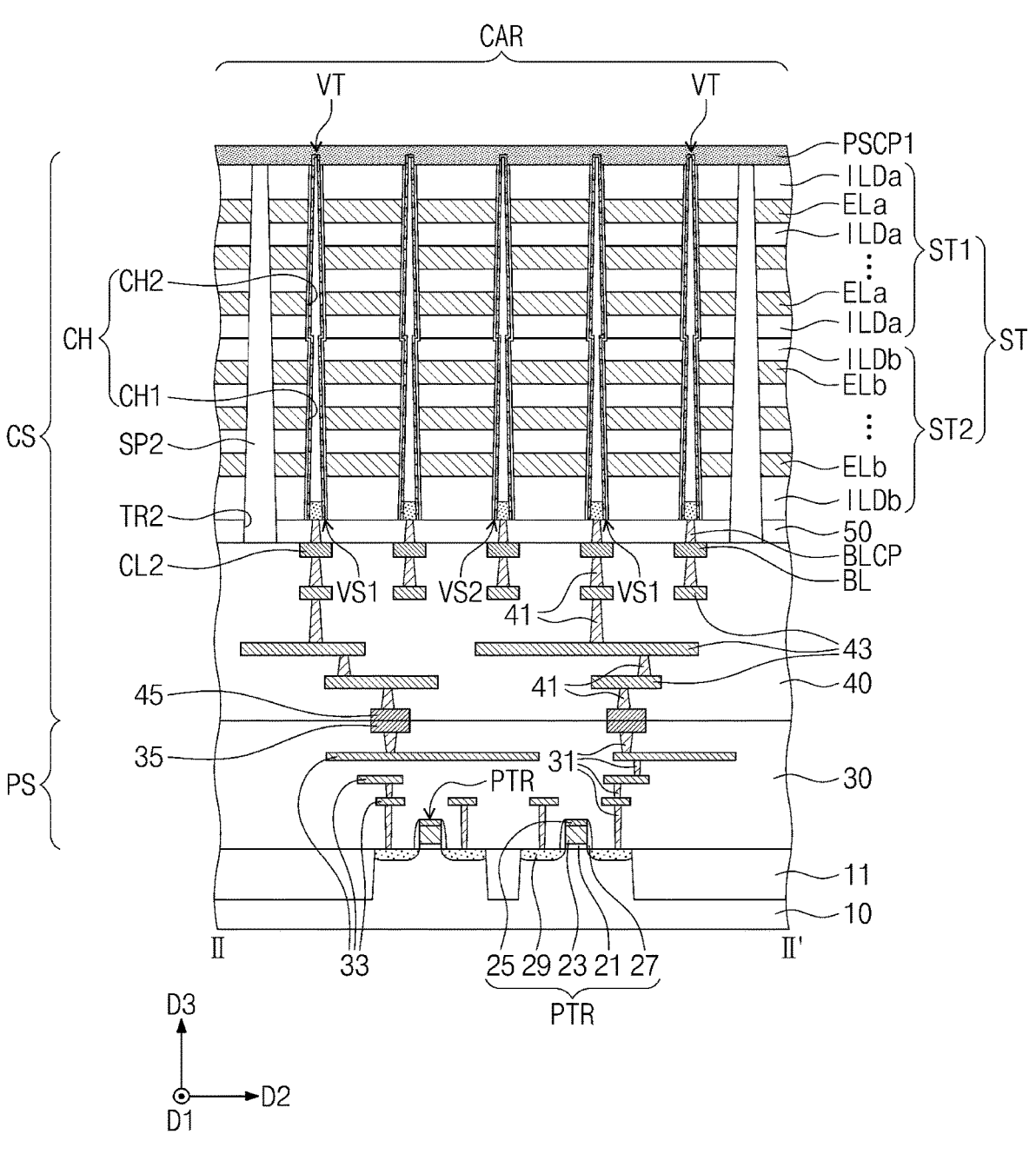

Referring to FIGS. 12A and 12B, a preliminary first source conductive pattern PSCP1 covering an topmost one of the fourth interlayer insulating layer 60 and the first interlayer insulating layers ILDa may be formed. For example, the preliminary first source conductive pattern PSCP1 may include polycrystalline silicon doped with a doped n-type dopant. The preliminary first source conductive pattern PSCP1 may be in contact with upper portions of the exposed vertical semiconductor patterns VSP. The preliminary first source conductive pattern PSCP1 may cover the exposed upper portion of the through contact plug TCP and the upper portion of the source contact plug DCP.

Figure 13A:
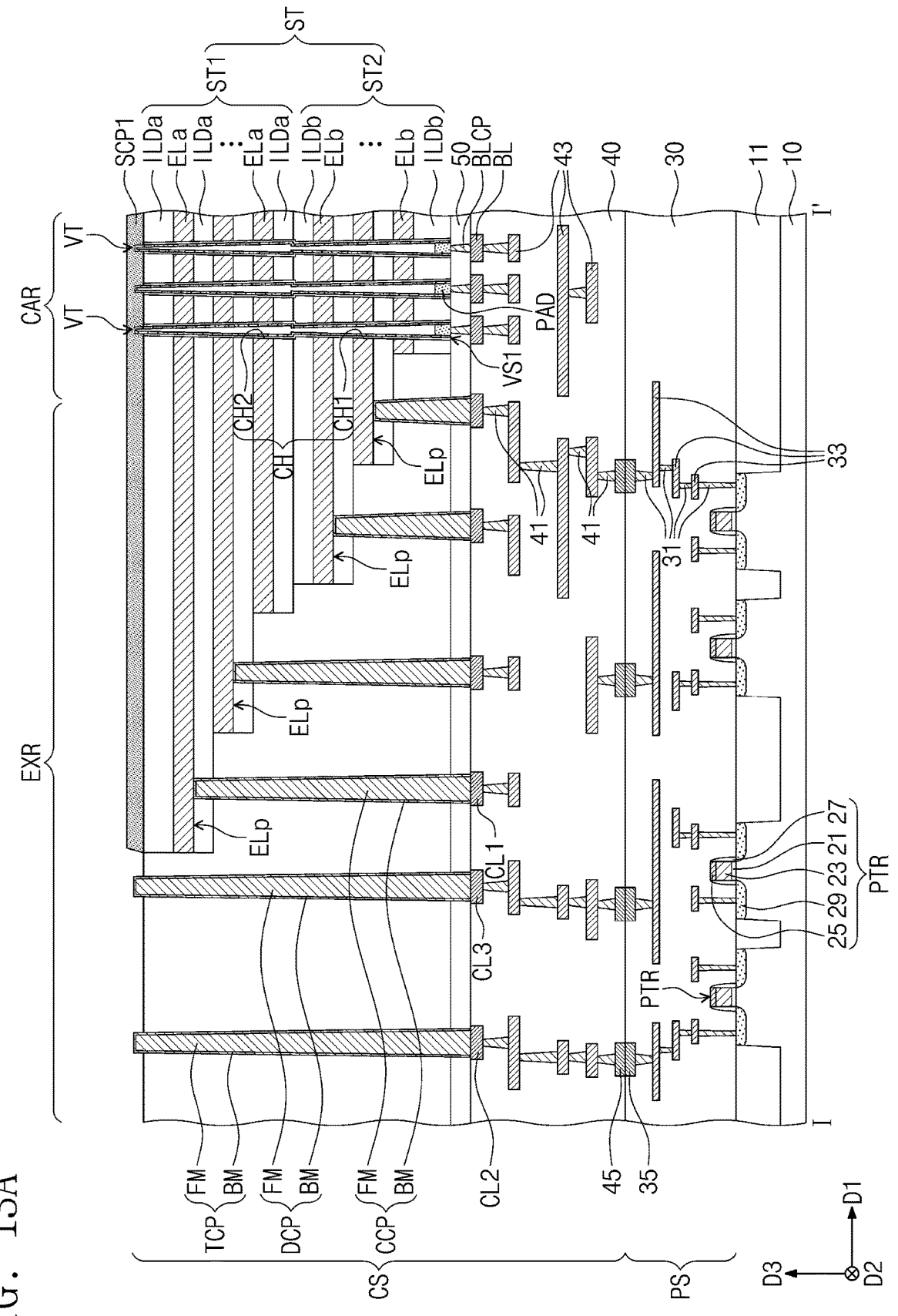
Figure 13B:
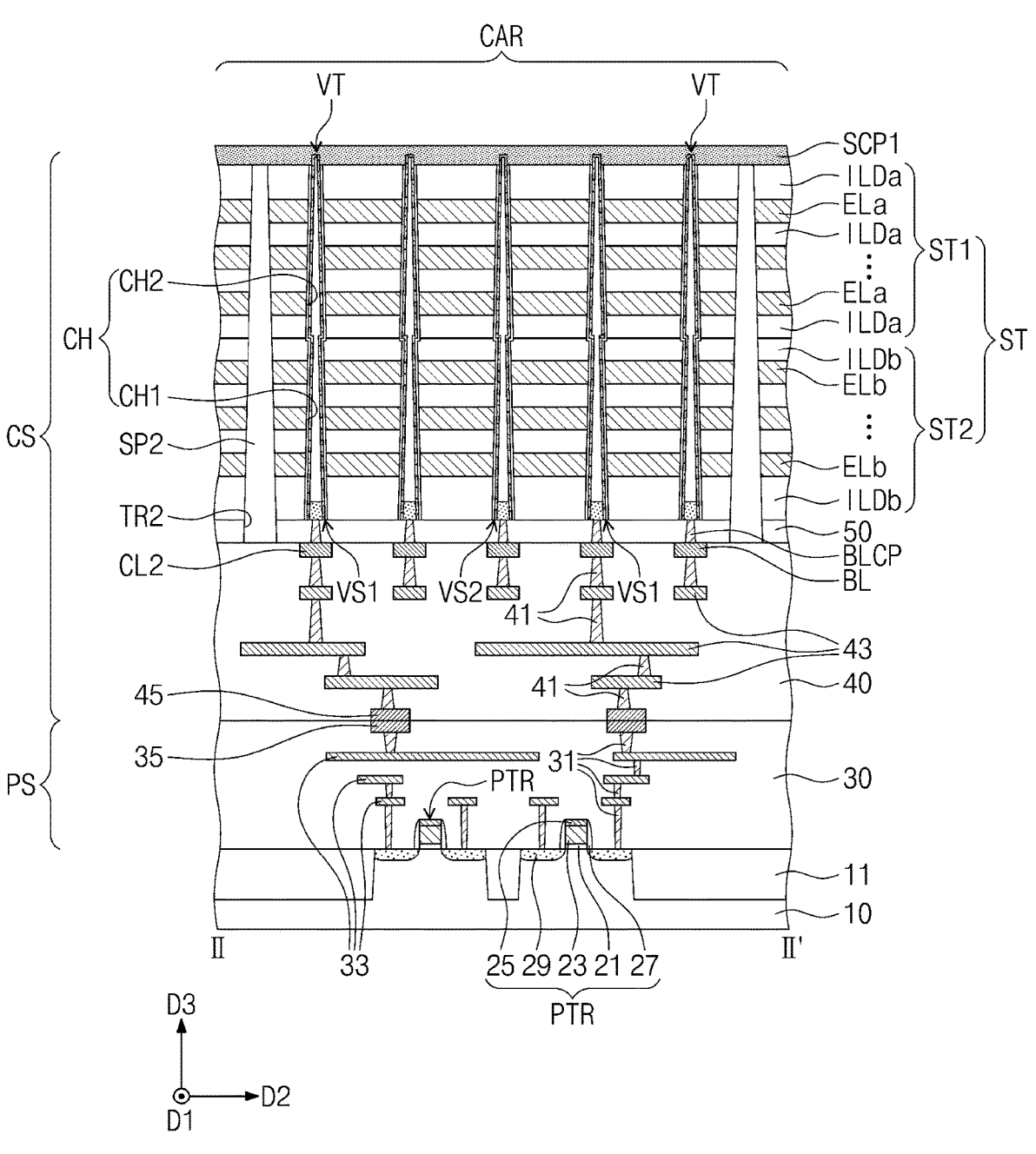

Referring to FIGS. 13A and 13B, a portion of the preliminary first source conductive pattern PSCP1 may be removed to expose the upper portion of the through contact plug TCP and the upper portion of the source contact plug DCP. As a result, a first source conductive pattern SCP1 may be formed.

Figure 14A:
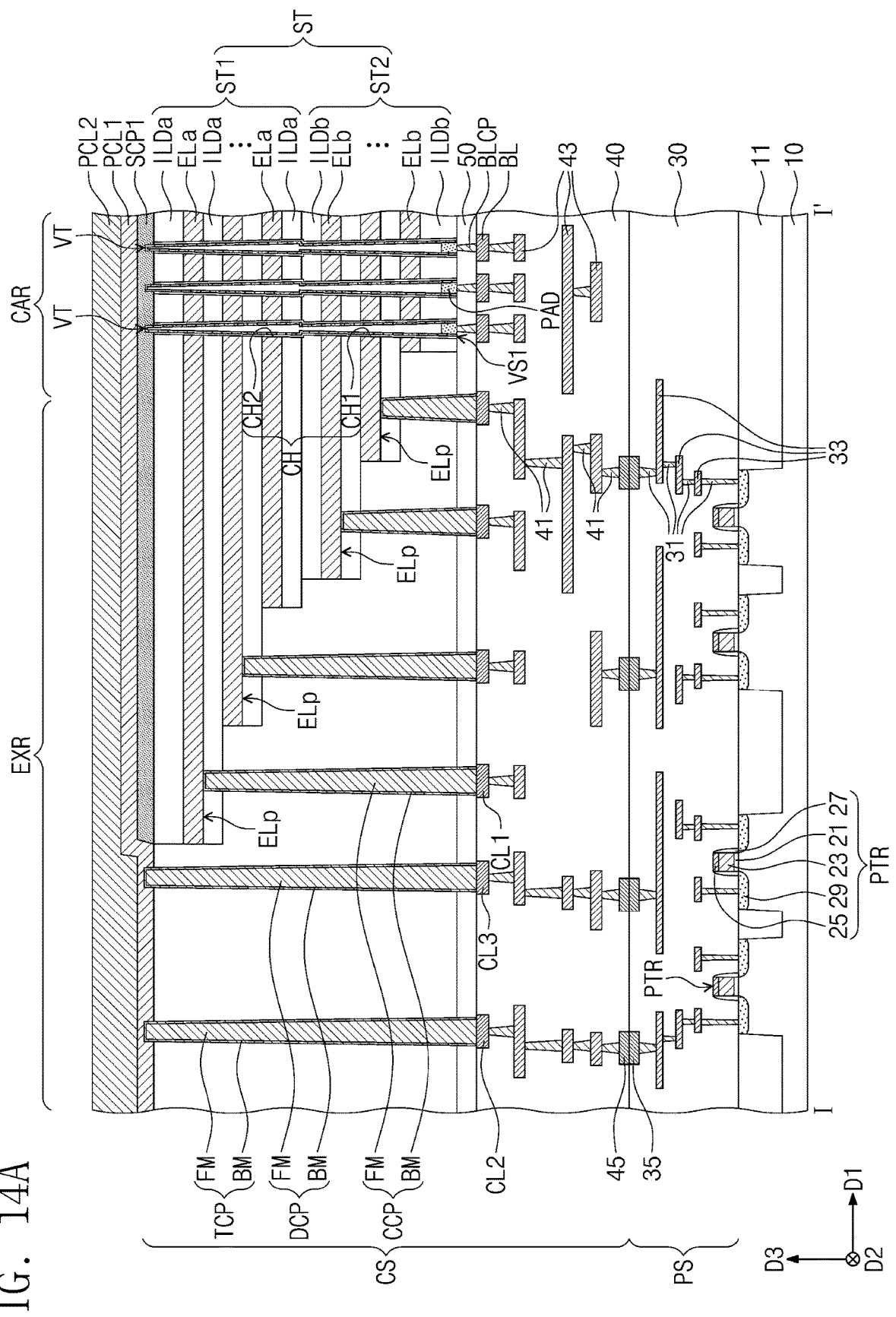
Figure 14B:
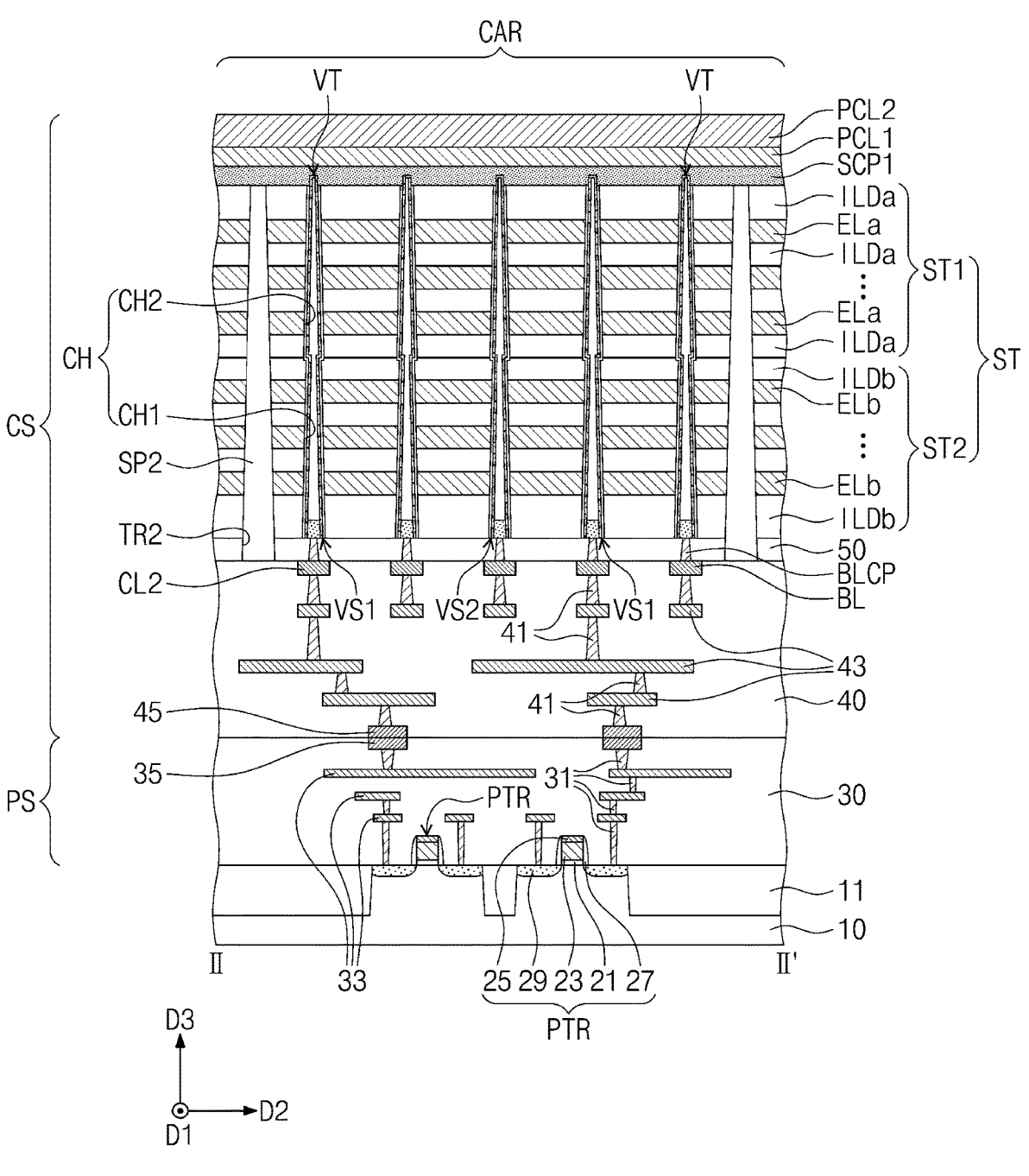

Referring to FIGS. 14A and 14B, a first preliminary conductive layer PCL1 covering the fourth interlayer insulating layer 60 and the first source conductive pattern SCP1 may be formed. A second preliminary conductive layer PCL2 may be formed to cover the first preliminary conductive layer PCL1. The first preliminary conductive layer PCL1 may include, for example, tungsten and/or tungsten nitride. The second preliminary conductive layer PCL2 may include a metal such as aluminum.

Referring to FIGS. 5, 6A, and 6B again, a patterning process may be performed on the first preliminary conductive layer PCL1 and the second preliminary conductive layer PCL2 to form a second source conductive pattern SCP2 and a third source conductive pattern SCP3, a first rear conductive pattern 195, and a second rear conductive pattern 199.

In detail, the second source conductive pattern SCP2, the third source conductive pattern SCP3, the first rear conductive pattern 195, and the second rear conductive pattern 199 may be formed through forming a mask pattern covering the second preliminary conductive layer PCL2 and patterning the first preliminary conductive layer PCL1 and the second preliminary conductive layer PCL2 using the mask pattern as an etch mask. The second source conductive pattern SCP2 and the third source conductive pattern SCP3 may be formed by one patterning and thus a second sidewall SW2 of the second source conductive pattern SCP2 and a third sidewall SW3 of the third source conductive pattern SCP3 may be aligned with each other.

According to the manufacturing method of the inventive concept, the second source conductive pattern SCP2, the third source conductive pattern SCP3, the first rear conductive pattern 195, and the second rear conductive pattern 199 may be formed through a single patterning process, thereby simplifying a manufacturing process.

Thereafter, a fifth interlayer insulating layer 188 covering the fourth interlayer insulating layer 60 may be formed. The fifth interlayer insulating layer 188 may cover the second sidewall SW2 of the second source conductive pattern SCP2, the third sidewall SW3 of the third source conductive pattern SCP3, and sidewalls of the first and second rear conductive patterns 195 and 199. A sixth interlayer insulating layer 190 covering the fifth interlayer insulating layer 188 and the third source conductive pattern SCP3 may be formed. For example, the fifth and sixth interlayer insulating layers 188 and 190 may be formed of silicon oxide.

According to embodiments of the inventive concept, the second source conductive pattern may be disposed between the first source conductive pattern and the third source conductive pattern. Accordingly, the phenomenon in which the third source conductive pattern is diffused into the first source conductive pattern and the void is formed in the third source conductive pattern may be prevented. In addition, the thickness of the common source line may be increased by providing the second source conductive pattern and the third source conductive pattern on the first source conductive pattern, and thus the common source line noise may be decreased. Accordingly, the electrical characteristics and reliability of the three-dimensional semiconductor memory device may be improved.

According to the manufacturing method of the inventive concept, the second and third source conductive patterns and the first and second rear conductive patterns may be formed through the single patterning process, thereby simplifying the process.

Herein, a lower side, a lower portion, a lower surface, and the like, are used to refer to a direction toward a lower structure or a substrate in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer as well as a direct connection between two components without intervening layers or components. In addition, "electrical connection" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While embodiments are described above, a person skilled in the art may understand that many modifications and variations are made without departing from the spirit and scope of the inventive concept defined in the following claims. Accordingly, the example embodiments of the inventive concept should be considered in all respects as illustrative and not restrictive, with the spirit and scope of the inventive concept being indicated by the appended claims.

What is claimed is:

1. A three-dimensional semiconductor memory device comprising:
   a substrate;
   a peripheral circuit structure on the substrate; and
   a cell array structure on the peripheral circuit structure and including a cell array region and a cell array contact region,
   wherein the cell array structure includes:
   a stack structure including alternately stacked interlayer insulating layers and gate electrodes;
   a first source conductive pattern, a second source conductive pattern, and a third source conductive pattern sequentially stacked on the stack structure and including different materials from each other; and
   vertical channel structures extending into a lower portion of the first source conductive pattern through the stack structure,
   wherein the first source conductive pattern, the second source conductive pattern, and the third source conductive pattern extend from the cell array region to the cell array contact region,
   wherein the vertical channel structures include vertical semiconductor patterns that contact the first source conductive pattern, wherein the second source conductive pattern and the third source conductive pattern extend onto a sidewall of the first source conductive pattern, and wherein a sidewall of the second source conductive pattern and a sidewall of the third source conductive pattern, which are opposite the sidewall of the first source conductive pattern, are aligned with each other.

2. The three-dimensional semiconductor memory device of claim 1, wherein the first source conductive pattern includes doped polycrystalline silicon, and
   wherein the second source conductive pattern includes tungsten and/or tungsten nitride.

3. The three-dimensional semiconductor memory device of claim 2, wherein the third source conductive pattern includes aluminum.

4. The three-dimensional semiconductor memory device of claim 1, further comprising:
   a through contact plug on the cell array contact region and spaced apart from the stack structure; and
   a first rear conductive pattern and a second rear conductive pattern sequentially stacked on the through contact plug,
   wherein the through contact plug penetrates into the first rear conductive pattern.

5. The three-dimensional semiconductor memory device of claim 4, wherein the first rear conductive pattern includes a tungsten layer and/or a tungsten nitride layer, and
   wherein the second rear conductive pattern includes aluminum.

6. The three-dimensional semiconductor memory device of claim 4, wherein a top surface of the through contact plug is lower than a top surface of the first source conductive pattern, relative to the substrate.

7. The three-dimensional semiconductor memory device of claim 4, wherein a bottom surface of the first rear conductive pattern is at a same level as a bottommost surface of the second source conductive pattern, relative to the substrate.

8. The three-dimensional semiconductor memory device of claim 7, wherein a top surface of the second rear conductive pattern is at a same level as a top surface of the third source conductive pattern, relative to the substrate.

9. The three-dimensional semiconductor memory device of claim 1, wherein the vertical channel structures further include data storage patterns on outer walls of the vertical semiconductor patterns and buried insulating patterns on inner walls of the vertical semiconductor patterns, and
   wherein top surfaces of the vertical semiconductor patterns are at a higher level than top surfaces of the data storage patterns, relative to the substrate.

10. The three-dimensional semiconductor memory device of claim 1, wherein a thickness of the third source conductive pattern is greater than a thickness of the second source conductive pattern.

11. The three-dimensional semiconductor memory device of claim 1, wherein the stack structure includes a first stack structure and a second stack structure,
    wherein the cell array structure includes a separation pattern between the first stack structure and the second stack structure, and
    wherein a top surface of the separation pattern is at a lower level than top surfaces of the vertical channel structures, relative to the substrate.

12. A three-dimensional semiconductor memory device comprising:
    a substrate;
    a peripheral circuit structure on the substrate; and a cell array structure on the peripheral circuit structure and including a cell array region and a cell array contact region,
wherein the cell array structure includes:
a stack structure including alternately stacked interlayer insulating layers and gate electrodes;
a first source conductive pattern, a second source conductive pattern, and a third source conductive pattern sequentially stacked on the stack structure and including different materials from each other;
vertical channel structures penetrating through the stack structure and extending into a lower portion of the first source conductive pattern;
cell contact plugs electrically connected to each of the gate electrodes in the cell array contact region;
a source contact plug in the cell array contact region; and
conductive lines electrically connected to the cell contact plugs,
wherein the second source conductive pattern has a first protrusion extending onto a sidewall of the first source conductive pattern, and
wherein a top surface of the source contact plug is in contact with the first protrusion.

13. The three-dimensional semiconductor memory device of claim 12, wherein the first source conductive pattern includes doped polycrystalline silicon, and
wherein the second source conductive pattern includes tungsten and/or tungsten nitride.

14. The three-dimensional semiconductor memory device of claim 13, wherein the third source conductive pattern includes aluminum.

15. The three-dimensional semiconductor memory device of claim 12, wherein the third source conductive pattern has a second protrusion extending onto the first protrusion, and
wherein a top surface of the source contact plug is lower than a bottom surface of the second protrusion of the third source conductive pattern, relative to the substrate.

16. The three-dimensional semiconductor memory device of claim 15, wherein a sidewall of the first protrusion and a sidewall of the second protrusion are aligned with each other.

17. The three-dimensional semiconductor memory device of claim 12, further comprising:
a through contact plug on the cell array contact region and spaced apart from the stack structure; and a first rear conductive pattern and a second rear conductive pattern sequentially stacked on the through contact plug,
wherein the through contact plug penetrates into the first rear conductive pattern.

18. The three-dimensional semiconductor memory device of claim 12, wherein the vertical channel structures include vertical semiconductor patterns electrically connected to the first source conductive pattern,
wherein the vertical channel structures further include data storage patterns on outer walls of the vertical semiconductor patterns and buried insulating patterns on inner walls of the vertical semiconductor patterns, and
wherein top surfaces of the vertical semiconductor patterns are at a higher level than top surfaces of the data storage patterns, relative to the substrate.

19. An electronic system comprising:
a three-dimensional semiconductor memory device including a substrate, a peripheral circuit structure on the substrate, and a cell array structure on the peripheral circuit structure and including a cell array region and a cell array contact region; and
a controller electrically connected to the three-dimensional semiconductor memory device and configured to control the three-dimensional semiconductor memory device,
wherein the cell array structure includes:
a stack structure including alternately stacked interlayer insulating layers and gate electrodes;
a first source conductive pattern, a second source conductive pattern, and a third source conductive pattern sequentially stacked on the stack structure and including different materials from each other;
vertical channel structures penetrating the stack structure and extending into a lower portion of the first source conductive pattern; and
a source contact plug in the cell array contact region,
wherein the second source conductive pattern has a protrusion extending onto a sidewall of the first source conductive pattern, and
wherein the source contact plug partially penetrates the protrusion of the second source conductive pattern.

* * * * *